United States Patent
Okumura et al.

(10) Patent No.: US 12,527,034 B2
(45) Date of Patent: Jan. 13, 2026

(54) DISPLAY DEVICE AND METHOD FOR FABRICATING THE SAME

(71) Applicant: Samsung Display Co., LTD., Yongin-si (KR)

(72) Inventors: Hiroshi Okumura, Yongin-si (KR); Jong Hoon Choi, Yongin-si (KR); Jong Jun Baek, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 451 days.

(21) Appl. No.: 18/118,190

(22) Filed: Mar. 7, 2023

(65) Prior Publication Data
US 2024/0032339 A1    Jan. 25, 2024

(30) Foreign Application Priority Data
Jul. 19, 2022 (KR) .......................... 10-2022-0088686

(51) Int. Cl.
*H10K 50/115*    (2023.01)
*H10D 30/01*    (2025.01)
(Continued)

(52) U.S. Cl.
CPC ..... *H10D 30/6757* (2025.01); *H10D 30/0321* (2025.01); *H10D 30/6713* (2025.01);
(Continued)

(58) Field of Classification Search
CPC ........... H10D 30/6713; H10D 30/6715; H10D 30/6757; H10K 59/1213
See application file for complete search history.

(56) References Cited

U.S. PATENT DOCUMENTS

| | | | |
|---|---|---|---|
| 5,508,216 A * | 4/1996 | Inoue | H10D 30/0321 |
| | | | 438/30 |
| 5,670,389 A * | 9/1997 | Huang | H10D 30/0323 |
| | | | 438/165 |

(Continued)

FOREIGN PATENT DOCUMENTS

| | | | | |
|---|---|---|---|---|
| CN | 1536681 A | * | 10/2004 | ............. G02F 1/133 |
| CN | 104576750 A | * | 4/2015 | ......... H10D 30/6746 |

(Continued)

OTHER PUBLICATIONS

Machine translation, Zhang, Chinese Pat. Pub. No. CN-104716199-A, translation date: Sep. 17, 2025, Espacenet, all pages. (Year: 2025).*

(Continued)

*Primary Examiner* — Victoria K. Hall
(74) *Attorney, Agent, or Firm* — Innovation Counsel LLP

(57) ABSTRACT

A display device includes an active layer disposed on a substrate, the active layer including a channel region and a first conductive region, the first conductive region including a first sub-conductive region disposed on a first side of the channel region, and a second sub-conductive region disposed between the first sub-conductive region and the channel region. The first conductive region further includes a first doped layer disposed on the substrate in the first sub-conductive region, a second doped layer disposed on the first doped layer in the first sub-conductive region, disposed on the substrate in the second sub-conductive region, and a third doped layer disposed on the second doped layer in the first sub-conductive region and the second sub-conductive region.

15 Claims, 28 Drawing Sheets

(51) Int. Cl.
*H10D 30/67* (2025.01)
*H10D 86/01* (2025.01)
*H10K 50/15* (2023.01)
*H10K 59/12* (2023.01)
*H10K 71/00* (2023.01)
*H10K 59/121* (2023.01)

(52) U.S. Cl.
CPC ....... *H10D 30/6729* (2025.01); *H10D 30/673* (2025.01); *H10D 30/6745* (2025.01); *H10D 30/6746* (2025.01); *H10D 86/0223* (2025.01); *H10K 59/1201* (2023.02); *H10K 59/1213* (2023.02)

(56) References Cited

U.S. PATENT DOCUMENTS

| | | | | |
|---|---|---|---|---|
| 5,693,959 A * | 12/1997 | Inoue | ................ | H10D 30/6713 257/408 |
| 2004/0191970 A1 * | 9/2004 | Sun | ................ | H10D 30/6733 257/E27.111 |
| 2005/0280030 A1 * | 12/2005 | Sun | ................ | H10D 86/00 257/E27.111 |
| 2008/0179597 A1 * | 7/2008 | Yamazaki | ............. | H10D 86/60 257/E33.001 |
| 2010/0224879 A1 * | 9/2010 | Miyairi | ............. | H10D 30/6745 257/66 |
| 2011/0096021 A1 * | 4/2011 | Kim | ................ | G06F 3/042 345/174 |
| 2012/0175627 A1 * | 7/2012 | Sun | ................ | H10D 86/00 257/72 |
| 2012/0319114 A1 * | 12/2012 | Yamazaki | .......... | H10D 30/6713 438/151 |
| 2022/0246756 A1 * | 8/2022 | Singh | ................ | H10D 30/0323 |

FOREIGN PATENT DOCUMENTS

| | | | | |
|---|---|---|---|---|
| CN | 104716199 A | * | 6/2015 | ............. H01L 21/18 |
| CN | 105762196 A | * | 7/2016 | ......... H10D 30/0321 |
| CN | 105977162 A | * | 9/2016 | ............. H10D 30/67 |
| CN | 109713044 A | * | 5/2019 | ........... H01L 21/336 |
| JP | S58158971 A | * | 9/1983 | ............. H01L 29/78 |
| KR | 10-2015-0048361 | | 5/2015 | |
| KR | 10-2022-0085070 | | 6/2022 | |
| WO | 1997-006564 | | 2/1997 | |

OTHER PUBLICATIONS

Machine translation, Yang, Chinese Pat. Pub. No. CN-109713044-A, translation date: Sep. 17, 2025, Espacenet, all pages. (Year: 2025).*
Machine translation, Li, Chinese Pat. Pub. No. CN-105977162-A, translation date: Sep. 17, 2025, Espacenet, all pages. (Year: 2025).*
Machine translation, Li, Chinese Pat. Pub. No. CN-1536681-A, translation date: Sep. 17, 2025, Espacenet, all pages. (Year: 2025).*
Machine translation, Liu, Chinese Pat. Pub. No. CN-105762196-A, translation date: Sep. 17, 2025, Espacenet, all pages. (Year: 2025).*
Machine translation, Hu, Chinese Pat. Pub. No. CN-104576750-A, translation date: Sep. 17, 2025, Espacenet, all pages. (Year: 2025).*
Machine translation, Ogata, Japanese Pat. Pub. No. JP-S58158971A, translation date: Sep. 17, 2025, Espacenet, all pages. (Year: 2025).*

* cited by examiner

ACT : SR, CR, DR
SR : SR1, SR2
DR : DR1, DR2
GR : SG1, SG2, CG, DG1, DG2
GB : SGB1, SGB2, CGB, DGB1, DGB2

DISPLAY DEVICE AND METHOD FOR FABRICATING THE SAME

CROSS-REFERENCE TO RELATED APPLICATION

This application claims priority from and benefits of Korean Patent Application No. 10-2022-0088686 under 35 U.S.C. § 119, filed on Jul. 19, 2022 in the Korean Intellectual Property Office (KIPO), the contents of which in its entirety are herein incorporated by reference.

BACKGROUND

1. Technical Field

The disclosure relates to a display device and a method of fabricating the same.

2. Description of the Related Art

With the advance of information-oriented society, more and more demands are placed on display devices for displaying images in various ways. The display device may be a flat panel display device such as a liquid crystal display, a field emission display and a light emitting display. A light emitting display device may include an organic light emitting display device including an organic light emitting diode as a light emitting element or an inorganic light emitting display device including an inorganic semiconductor device as a light emitting element.

Among the display devices, the organic light emitting display device displays an image using an organic light emitting element that generates light by recombination of electrons and holes. The organic light emitting display device includes multiple thin film transistors that provide a driving current to the organic light emitting element.

A floating body effect, in which carriers are accumulated in a channel region included in an active layer of each of the thin film transistors, may occur. Since the potential of the channel region of the thin film transistor may be changed and the threshold voltage of the thin film transistor may be shifted, the reliability of the thin film transistor may deteriorate.

SUMMARY

Aspects of the disclosure provide a display device capable of reducing or preventing a threshold voltage shift of a thin film transistor due to a floating body effect.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device comprises an active layer disposed on a substrate, the active layer comprising a channel region and a first conductive region, the first conductive region comprising a first sub-conductive region disposed on a first side of the channel region, and a second sub-conductive region disposed between the first sub-conductive region and the channel region, wherein the first conductive region further comprises a first doped layer being disposed on the substrate in the first sub-conductive region, wherein in the first doped layer, a concentration of a first dopant is higher than a concentration of a second dopant that is different from the first dopant, a second doped layer being disposed on the first doped layer in the first sub-conductive region, the second doped layer being disposed on the substrate in the second sub-conductive region, wherein in the second doped layer, a concentration of the second dopant is higher than a concentration of the first dopant, and a third doped layer being disposed on the second doped layer in both the first sub-conductive region and the second sub-conductive region, wherein in the third doped layer, a concentration of the second dopant is higher than a concentration of the first dopant.

In an embodiment, wherein a thickness of the first doped layer may be smaller than a thickness of the channel region.

In an embodiment, wherein a thickness of the second doped layer may be smaller than each of a thickness of the first doped layer and a thickness of the third doped layer.

In an embodiment, wherein a thickness of the first sub-conductive region may be greater than a thickness of the second sub-conductive region.

In an embodiment, wherein the channel region may comprise the first dopant, a concentration of the first dopant in the first doped layer may be higher than a concentration of the first dopant in the channel region, and the first dopant may be a p-type dopant, and the second dopant is an n-type dopant.

In an embodiment, wherein the channel region may comprise the first dopant, a concentration of the first dopant in the first doped layer may be higher than a concentration of the first dopant in the channel region, and the first dopant may be an n-type dopant, and the second dopant is a p-type dopant.

In an embodiment, wherein the channel region may contain the second dopant, a concentration of the second dopant in the second doped layer may be higher than a concentration of the second dopant in the channel region, and the first dopant may be an n-type dopant, and the second dopant is a p-type dopant.

In an embodiment, the active layer further comprises a second conductive region disposed on a second and opposite side of the channel region, and wherein the second conductive region and the first conductive region may have a same structure, the second conductive region may be symmetrical with the first conductive region.

In an embodiment, the display device may further comprise a first gate insulating layer disposed on the active layer, and a gate electrode disposed on the first gate insulating layer and overlapping the channel region in a plan view.

In an embodiment, wherein the first gate insulating layer may be disposed at a portion where the gate electrode and the channel region overlap, and may not overlap the first conductive region and the second conductive region in a plan view.

In an embodiment, the display device may further comprise a second gate insulating layer disposed on the gate electrode, a first contact hole and a second contact hole each penetrating both of the first gate insulating layer and the second gate insulating layer, a source electrode disposed on the second gate insulating layer and electrically connected to the first conductive region exposed through the first contact hole, and a drain electrode disposed on the second gate insulating layer and electrically connected to the second conductive region exposed through the second contact hole.

According to an embodiment of the disclosure, a display device comprises an active layer disposed on a substrate, the active layer comprising a first conductive region comprising a channel region comprising a first dopant and a first conductive region comprising a first sub-conductive region disposed on a first side of the channel region, and a second sub-conductive region disposed between the first sub-conductive region and the channel region, wherein the first conductive region further comprises a first doped layer disposed on the substrate in the first sub-conductive region, wherein in the first doped layer, a concentration of the first dopant is higher than a concentration of a second dopant that is different from the first dopant, a second doped layer being disposed on the first doped layer in the first sub-conductive region, the second doped layer also being disposed on the substrate in the second sub-conductive region, wherein in the second doped layer, a concentration of the second dopant is higher than a concentration of the first dopant, and a third doped layer disposed on the second doped layer in the first sub-conductive region and the second sub-conductive region, and in which a concentration of the second dopant is higher than a concentration of the first dopant, wherein a concentration of the second dopant in the third doped layer is higher than a concentration of the second dopant in the second doped layer, and a grain size of the first sub-conductive region is smaller than a grain size of the second sub-conductive region.

In an embodiment, wherein a grain boundary density in the first sub-conductive region may be greater than a grain boundary density in the second sub-conductive region.

In an embodiment, wherein a thickness of the first sub-conductive region may be greater than a thickness of the channel region.

In an embodiment, wherein a thickness of the second sub-conductive region may be substantially equal to a thickness of the channel region.

According to an embodiment of the disclosure, a method of fabricating a display device comprises forming an amorphous silicon layer on a substrate, patterning the amorphous silicon layer to have a first region and a second region having different thicknesses, forming a polycrystalline silicon layer by irradiating a laser beam onto the amorphous silicon layer, primarily doping a first dopant into the polycrystalline silicon layer, forming a gate insulating layer and a gate electrode sequentially on the polycrystalline silicon layer, secondarily doping the first dopant onto the polycrystalline silicon layer, and doping a second dopant that is different from the first dopant onto the polycrystalline silicon layer.

In an embodiment, wherein the first dopant may be a p-type dopant, and the second dopant may be an n-type dopant.

In an embodiment, wherein a thickness of the first region may be greater than a thickness of the second region, a grain size in the first region may be smaller than a grain size in the second region, and a grain boundary density of the first region may be greater than a grain boundary density of the second region.

In an embodiment, wherein in the secondarily doping of the first dopant onto the polycrystalline silicon layer and in the doping of the second dopant different from the first dopant onto the polycrystalline silicon layer, a doping depth of the first dopant may be greater than a doping depth of the second dopant with respect to a top surface of the polycrystalline silicon layer.

In an embodiment, wherein in the forming of the gate insulating layer and the gate electrode on the polycrystalline silicon layer, the gate insulating layer may be formed on the polycrystalline silicon layer only at locations corresponding to the gate electrode.

In accordance with a display device according to an embodiment, lower regions of a source region and a drain region of an active layer and a lower region of a channel region thereof are doped with different dopants to have bipolarity. Due to this, since carriers, which are accumulated in the channel region, are recombined and dissipated at grain boundaries included in the source region and the drain region of the active layer, a floating body effect can be reduced or eliminated. Accordingly, problems such as reliability degradation of a thin film transistor and a threshold voltage shift according to a change in the potential of the channel region can be solved, thereby improving the reliability of the display device.

In accordance with a method for fabricating a display device according to one embodiment, since thicknesses of a source region, a drain region, and a channel region included in an active layer of a thin film transistor are made to be different from each other, it is possible to omit at least one mask process and at least one doping process of the active layer of the thin film transistor. Therefore, the f fabrication process can be simplified and the fabrication cost can be reduced.

However, the effects of the disclosure are not limited to the aforementioned effects, and various other effects are included in the disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
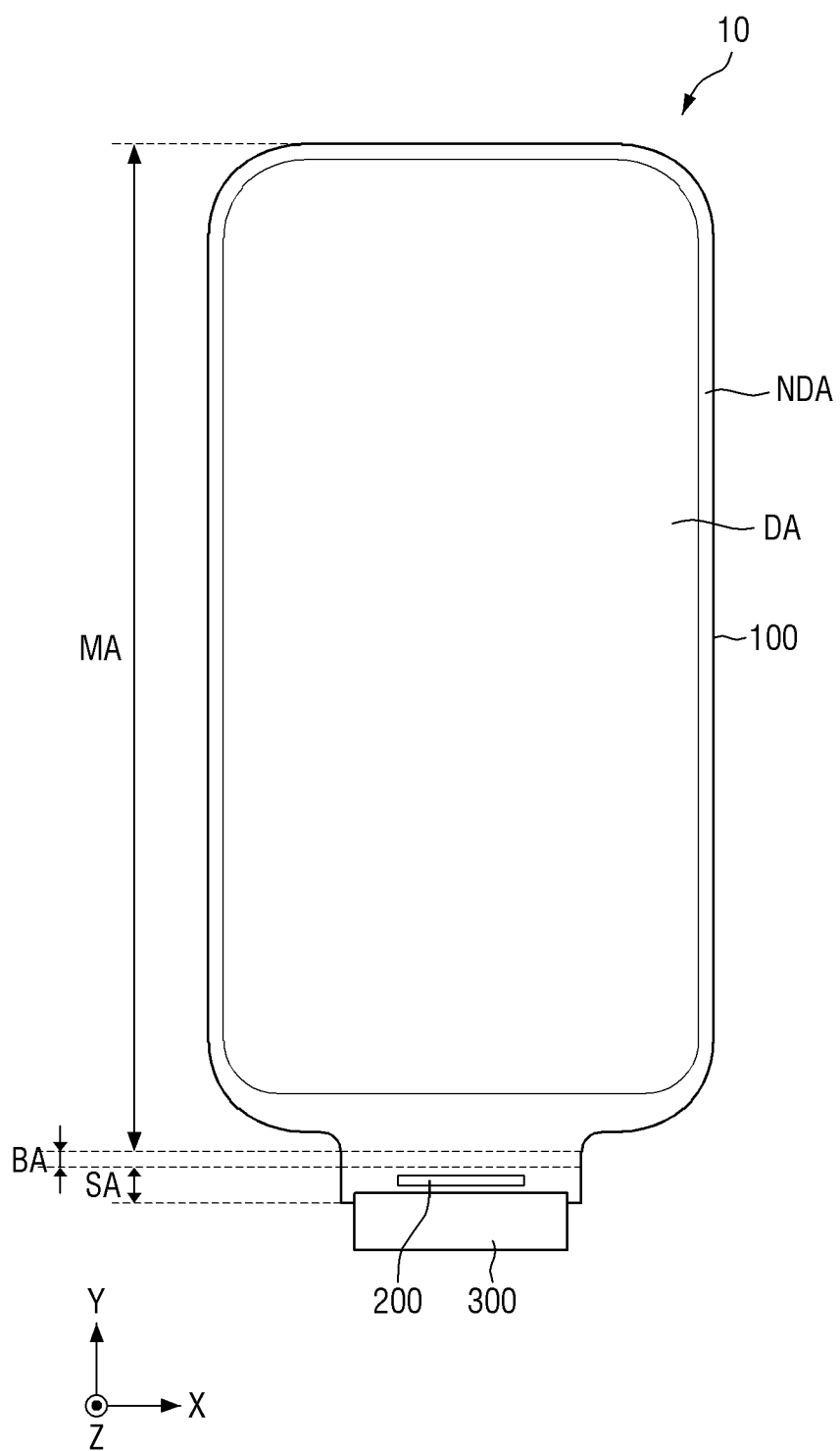
FIG. 1 is a schematic plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be more thorough and complete, and will convey the scope of the invention to those skilled in the art.

The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Features of each of various embodiments of the disclosure may be partially or entirely combined with each other and may technically variously interwork with each other, and respective embodiments may be implemented independently of each other or may be implemented together in association with each other.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described in detail with reference to the accompanying drawings.

Figure 2:
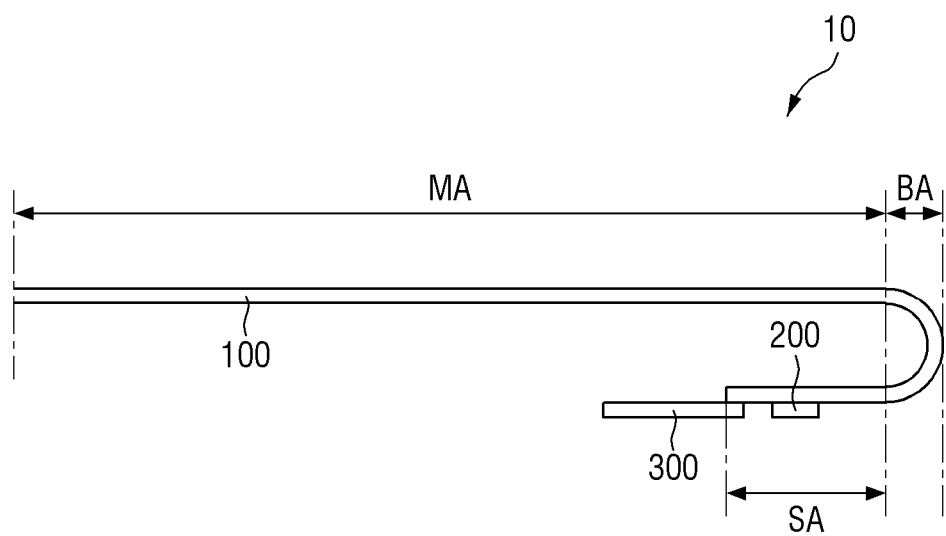
FIG. 2 is a schematic side view of the display device of FIG. 1 in a bent state.

FIG. 1 is a plan view of a display device according to an embodiment. FIG. 2 is a side view of the display device of FIG. 1 in a bent state.

Referring to FIGS. 1 and 2, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, the like, or a combination thereof, which provide a display screen.

The display device 10 according to an embodiment may have a substantially rectangular shape in plan view. The display device 10 may have a rectangular shape with right-angled corners in plan view. However, the disclosure is not limited thereto, and the display device 10 may have a rectangular shape with rounded corners in plan view.

The display device 10 includes a display panel 100 which provides a display screen. Examples of the display panel 100 may include an inorganic light emitting diode display panel, an organic light emitting display panel, a quantum dot light emitting display panel, a plasma display panel and a field emission display panel. Hereinafter, although the display device including an organic light emitting element is exemplified as an example of the display panel 100, the disclosure is not limited thereto, and other display panels may be applied within the same scope of technical spirit. The display panel 100 may be a flexible substrate including a flexible polymer material such as polyimide or the like. Accordingly, the display panel 100 can be curved, bent, folded or rolled.

In the drawings, a first direction X indicates a horizontal direction of a display device in plan view, and a second direction Y indicates a vertical direction of the display device in plan view. Further, a third direction Z indicates a thickness direction of the display device 10. The first direction X and the second direction Y perpendicularly intersect each other. The third direction Z may be a direction intersecting the plane on which the first direction X and the second direction Y are located, and perpendicularly intersects both the first direction X and the second direction Y. It should be understood, however, that a direction mentioned in the embodiment refers to a relative direction and the embodiment is not limited to the direction mentioned.

Unless otherwise defined, with respect to the third direction Z, the terms "above," "top surface," and "upper side" as used herein refer to a display surface's side of a display panel 100, and the terms "below," "bottom surface," and "lower side" as used herein refer to a side opposite to the display surface of the display panel 100.

The display panel 100 may include a display area DA displaying a screen and a non-display area NDA where no images are displayed. The display panel 100 may be divided into the display area DA and the non-display area NDA in plan view. The non-display area NDA may be disposed to surround the display area DA. The non-display area NDA may form a bezel.

The display area DA may have a rectangular shape with right-angled or rounded corners in plan view. The display area DA may have short and long sides. The short side of the display area DA may be a side extending in the first direction X. The long side of the display area DA may be a side extending in the second direction Y. However, the planar shape of the display area DA is not limited to a rectangular shape, but may have a circular shape, an elliptical shape, or various other shapes.

The display area DA may include multiple pixels. Each pixel may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation layer. A detailed configuration of the pixel will be described later.

The non-display area NDA may be disposed adjacent to both the short sides and both the long sides of the display area DA. The non-display area NDA may surround all sides of the display area DA and form edges of the display area DA. However, the disclosure is not limited thereto, and the non-display area NDA may be disposed adjacent to both short sides or both long sides of the display area DA.

The display panel 100 may include a main region MA and a bending region BA connected to a side of the main region MA in the second direction Y. The display panel 100 may further include a sub-region SA which may be connected to the bending region BA on a side of the second direction Y and is bent in a thickness direction to be overlapped by or be arranged underneath the main region MA in the thickness direction.

The display area DA may be located in the main region MA. The non-display area NDA may be located in the peripheral edge portion of the display area DA of the main region MA.

The main region MA may have a shape similar to an outer shape of the display device 10 in plan view. The main region MA may be a flat region located on a plane. However, the disclosure is not limited thereto, and at least one edge of the remaining edges except an edge (side) of the main region MA connected to the bending region BA may be bent in a curved shape or bent in a vertical direction.

If at least one of the edges other than the edge (side) of the main region MA connected to the bending region BA may be curved or bent, the display area DA may also be disposed on the corresponding edge. However, the disclosure is not limited thereto, and the non-display area NDA that does not display a screen may be disposed on the curved or bent edge. In an embodiment, both the display area DA and the non-display area NDA may be disposed thereon.

The non-display area NDA of the main region MA may be placed in an area from the outer boundary of the display area DA to the edge of the display panel 100. Signal wires or driving circuits may be disposed in the non-display area NDA of the main region MA to apply a signal to the display area DA.

The bending region BA may be connected through a short side of the main region MA. The width (width in the first direction X) of the bending region BA may be smaller than the width (width of the short side) of the main region MA. A connection portion between the main region MA and the bending region BA may have an L-shaped cut portion to reduce the width of the bezel.

In the bending region BA, the display panel 100 may be bent with a curvature in a direction opposite to the display surface. The surface of the display panel 100 may be reversed as the display panel 100 is bent in the bending region BA. In other words, a surface of the display panel 100 facing upward may be changed to face laterally outward through the bending region BA and then to face downward.

The sub-region SA extends from the bending region BA. The sub-region SA may extend in a direction parallel to the main region MA from a point where bending may be completed. The sub-region SA may be overlapped by or arranged underneath the main region MA in the thickness direction of the display panel 100. The sub-region SA may be overlapped by or arranged underneath the non-display area NDA of the edge of the main region MA and further be overlapped by or arranged underneath the display area DA of the main region MA in a plan view. The width of the sub-region SA may be the same as the width of the bending region BA, but is not limited thereto.

A pad portion may be disposed on the sub-region SA of the display panel 100. An external device may be mounted on (or attached to) the pad portion. The examples of the external device may include a driving chip 200 and a driving board 300 formed of a flexible or rigid printed circuit board, and a wiring connection film, a connector, or the like may also be mounted on the pad portion as an external device. It may be possible for one or more external devices to be mounted on the sub-region SA. For example, as exemplarily shown in FIGS. 1 and 2, the driving chip 200 may be arranged on the sub-region SA of the display panel 100, and the driving board 300 may be attached to an end of the sub-region SA. The display panel 100 may include a pad member electrically connected to the driving chip 200 and another pad member electrically connected to the driving board 300. In an another embodiment, the driving chip 200 may be mounted on a film, which may be adhered to the sub-region SA of the display panel 100.

The driving chip 200, which may be mounted on a surface of the display panel 100 which may be a same surface as the display surface, may be mounted on the surface of the display panel 100 facing downward in the thickness direction as the bending region BA may be bent and reversed as described above such that the top surface of the driving chip 200 faces downward.

The driving chip 200 may be attached onto the display panel 100 through an anisotropic conductive film or through ultrasonic bonding. The width of the driving chip 200 in the horizontal direction may be smaller than that of the display panel 100 in the horizontal direction. The driving chip 200 may be disposed in a central portion of the sub-region SA in the horizontal direction (first direction X). The left edge and the right edge of the driving chip 200 may be separated from the left edge and the right edge of the sub-region SA, respectively.

The driving chip 200 may include an integrated circuit for driving the display panel 100. In an embodiment, the integrated circuit may be, but is not limited to, a data driving integrated circuit that generates and provides a data signal. The driving chip 200 may be electrically connected to a wire pad prepared on the pad portion of the display panel 100 to provide the data signal toward the wire pad. Wires electrically connected to the wire pad extend toward the pixel and apply the data signal or the like to each pixel.

Figure 3:
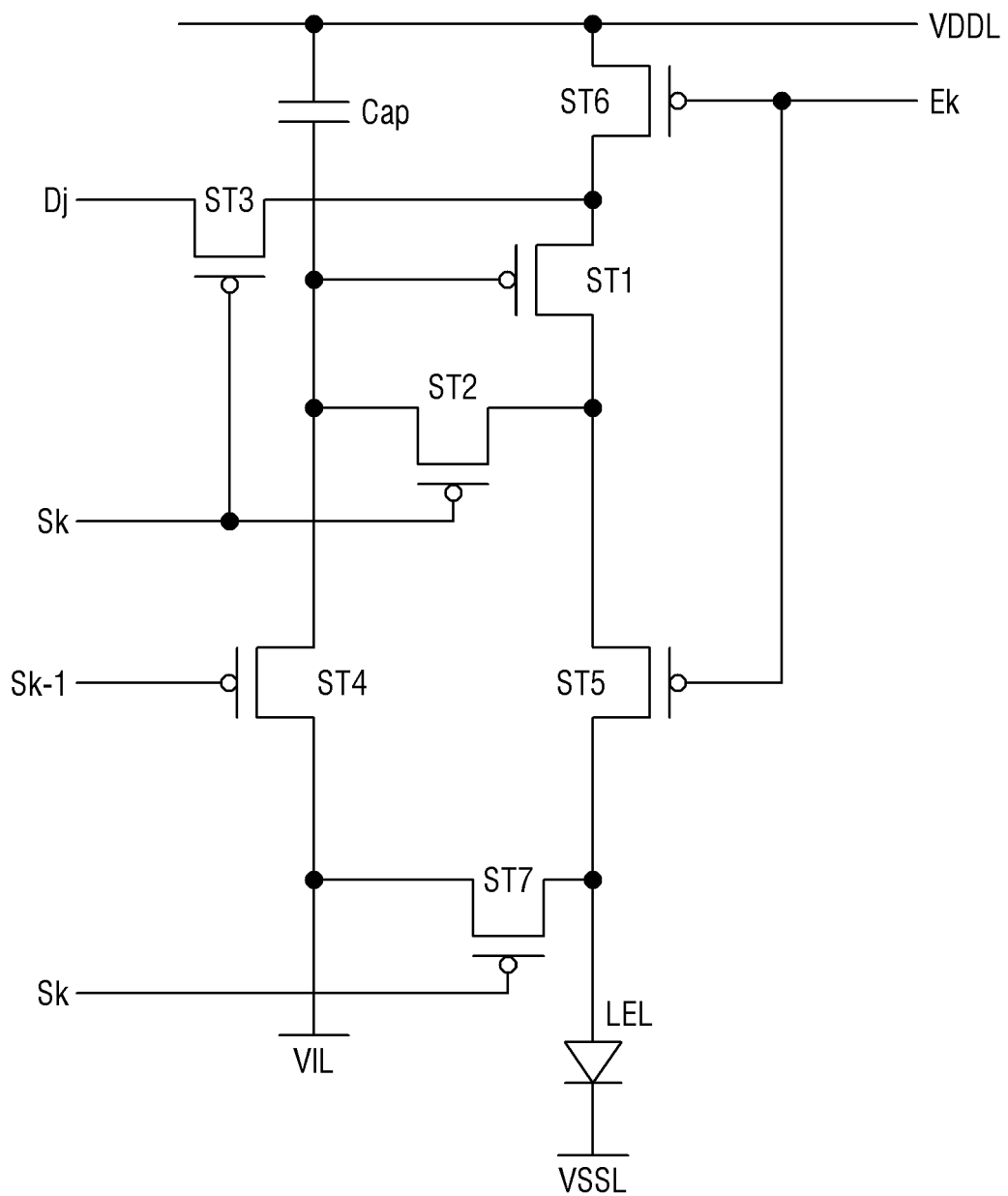
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, the sub-pixels disposed in the display area DA of the display panel 100 (see FIG. 1) may be electrically connected to a $(k-1)^{th}$ scan line Sk-1, a $k^{th}$ scan line Sk, and a $j^{th}$ data line Dj. K and j may be natural numbers of 1 or more. Further, the sub-pixel may be electrically connected to a first driving voltage line VDDL to which a first driving voltage may be supplied, an initialization voltage line VIL to which an initialization voltage may be supplied, and a second driving voltage line VSSL to which a second driving voltage having a voltage value lower than that of the first driving voltage may be supplied.

The sub-pixel includes a transistor portion including multiple thin film transistors and a light emitting element LEL. The transistor portion includes a driving thin film transistor and a switching thin film transistor. The driving thin film transistor may receive the first driving voltage or the second driving voltage and supply a driving current to the light emitting element LEL, and the switching thin film transistor may transmit a data signal to the driving thin film transistor.

The transistor portion may include a first thin film transistor ST1 as the driving thin film transistor, and may include a second thin film transistor ST2, a third thin film transistor ST3, a fourth thin film transistor ST4, a fifth thin film transistor ST5, a sixth thin film transistor ST6, a seventh thin film transistor ST7, or a combination thereof as the switching thin film transistors. In other words, the transistor portion may include multiple thin film transistors, i.e., the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7.

The first thin film transistor ST1 may include a first gate electrode, a first semiconductor active region, a first electrode, a second electrode, the like, or a combination thereof. The first thin film transistor ST1 controls a drain-source current flowing between the first electrode and the second electrode in response to the data voltage applied to the first gate electrode. The driving current flowing through the channel of the first thin film transistor ST1 may be proportional to the square of the difference between the threshold voltage and the voltage between the first gate electrode and the first electrode of the first thin film transistor ST1 as shown in Eq. (1).

$$Ids = k' \times (Vgs - Vth)^2 \quad (1)$$

In Eq. (1), k' is a proportional coefficient determined by the structure and physical characteristics of the first thin film transistor ST1, Vgs is a gate-source voltage of the first thin film transistor ST1, Vth is a threshold voltage of the first thin film transistor ST1, and Ids is a driving current.

The light emitting element LEL may serve to emit light in response to the driving current. A light emission amount of the light emitting element LEL may be proportional to the driving current. The light emitting element LEL may include a first electrode, a second electrode, a light emitting layer disposed between the first electrode and the second electrode, or a combination thereof. The first electrode may be an anode electrode and the second electrode may be a cathode electrode.

The first electrode of the light emitting element LEL may be electrically connected to the first electrode of the seventh thin film transistor ST7 and the second electrode of the fifth thin film transistor ST5, and the second electrode thereof may be connected to the second driving voltage line VSSL.

The second thin film transistor ST2 may be turned on by the scan signal of the $k^{th}$ scan line Sk to connect the first gate electrode and the second electrode of the first thin film transistor ST1. For example, in case that the second thin film transistor ST2 is turned on, the first gate electrode and the second electrode of the first thin film transistor ST1 are electrically connected and thus the first thin film transistor ST1 operates as a diode. The second thin film transistor ST2 may include a second gate electrode, a second semiconductor active region, a first electrode, a second electrode, or a combination thereof. The second gate electrode may be electrically connected to the $k^{th}$ scan line Sk, the first electrode of the second thin film transistor ST2 may be electrically connected to the second electrode of the first thin film transistor ST1, and the second electrode of the second thin film transistor ST2 may be electrically connected to the first gate electrode of the first thin film transistor ST1.

The third thin film transistor ST3 may be turned on by the scan signal of the $k^{th}$ scan line Sk to electrically connect the first electrode of the first thin film transistor ST1 to the $j^{th}$ data line Dj. The third thin film transistor ST3 may include a third gate electrode, a third semiconductor active region, a first electrode, a second electrode, or a combination thereof. The third gate electrode of the third thin film transistor ST3 may be electrically connected to the $k^{th}$ scan line Sk, the first electrode of the third thin film transistor ST3 may be electrically connected to the first electrode of the first thin film transistor ST1, and the second electrode of the third thin film transistor ST3 may be electrically connected to the $j^{th}$ data line Dj.

The fourth thin film transistor ST4 may be turned on by the scan signal of the $(k-1)^{th}$ scan line Sk-1 to electrically connect the gate electrode of the first thin film transistor ST1 to the initialization voltage line VIL. The first gate electrode of the first thin film transistor ST1 may be discharged to an initialization voltage of the initialization voltage line VIL. The fourth thin film transistor ST4 may include a fourth gate electrode, a fourth semiconductor active region, a first electrode, a second electrode, or a combination thereof. The fourth gate electrode of the fourth thin film transistor ST4 may be electrically connected to the $(k-1)^{th}$ scan line Sk-1, the first electrode of the fourth thin film transistor ST4 may be electrically connected to the first gate electrode of the first thin film transistor ST1, and the second electrode of the fourth thin film transistor ST4 may be electrically connected to the initialization voltage line VIL.

The fifth thin film transistor ST5 may be electrically connected between the second electrode of the first thin film transistor ST1 and the first electrode of the light emitting element LEL. The fifth thin film transistor ST5 may be turned on by the emission control signal of a $k^{th}$ emission line Ek to electrically connect the second electrode of the first thin film transistor ST1 to the first electrode of the light emitting element LEL. The fifth thin film transistor ST5 may include a fifth gate electrode, a fifth semiconductor active region, a first electrode, a second electrode, or a combination thereof. The fifth gate electrode of the fifth thin film transistor ST5 may be electrically connected to the $k^{th}$ emission line Ek, the first electrode of the fifth thin film transistor ST5 may be electrically connected to the second electrode of the first thin film transistor ST1, and the second electrode of the fifth thin film transistor ST5 may be electrically connected to the first electrode of the light emitting element LEL.

The sixth thin film transistor ST6 may be turned on by the emission control signal of the $k^{th}$ emission line Ek to electrically connect the first electrode of the first thin film transistor ST1 to the first driving voltage line VDDL. The sixth thin film transistor ST6 may include a sixth gate electrode, a sixth semiconductor active region, a first electrode, a second electrode, or a combination thereof. The sixth gate electrode of the sixth thin film transistor ST6 may be electrically connected to the $k^{th}$ emission line Ek, the first electrode of the sixth thin film transistor ST6 may be electrically connected to the first driving voltage line VDDL, and the second electrode of the sixth thin film transistor ST6 may be electrically connected to the first electrode of the first thin film transistor ST1. In case that both the fifth thin film transistor ST5 and the sixth thin film transistor ST6 are turned on, the driving current may be supplied to the light emitting element LEL.

The seventh thin film transistor ST7 may be turned on by the scan signal of the $k^{th}$ scan line Sk to electrically connect the first electrode of the light emitting element LEL to the initialization voltage line VIL. The first electrode of the light emitting element LEL may be discharged to the initialization voltage. The seventh thin film transistor ST7 may include a seventh gate electrode, a seventh semiconductor active region, a first electrode, a second electrode, or a combination thereof. The seventh gate electrode of the seventh thin film transistor ST7 may be electrically connected to the $k^{th}$ scan line Sk, the first electrode of the seventh thin film transistor ST7 may be electrically connected to the first electrode of the light emitting element LEL, and the second electrode of the seventh thin film transistor ST7 may be electrically connected to the initialization voltage line VIL.

The sub-pixel may further include a capacitor Cap. The capacitor Cap may be formed between the first gate electrode of the first thin film transistor ST1 and the first driving voltage line VDDL. An electrode of the capacitor Cap may be electrically connected to the first gate electrode of the first thin film transistor ST1, and the other electrode thereof may be electrically connected to the first driving voltage line VDDL.

In case that the first electrode of each of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 may be a source electrode, the second electrode thereof may be a drain electrode. In an embodiment, in case that the first electrode of each of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 is a drain electrode, the second electrode thereof may be a source electrode.

Each of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 may include a semiconductor active region as described above. The first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 may include the semiconductor active regions made of polycrystalline silicon, but the disclosure is not limited thereto.

In case that the semiconductor active regions of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 are made of polycrystalline silicon, they may be formed by a low-temperature polycrystalline silicon process. Further, although FIG. 3 has mainly described the case where the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 are formed as p-type thin film transistors, the disclosure is not limited thereto, and some or all of them may be formed as n-type thin film transistors.

Figure 4:
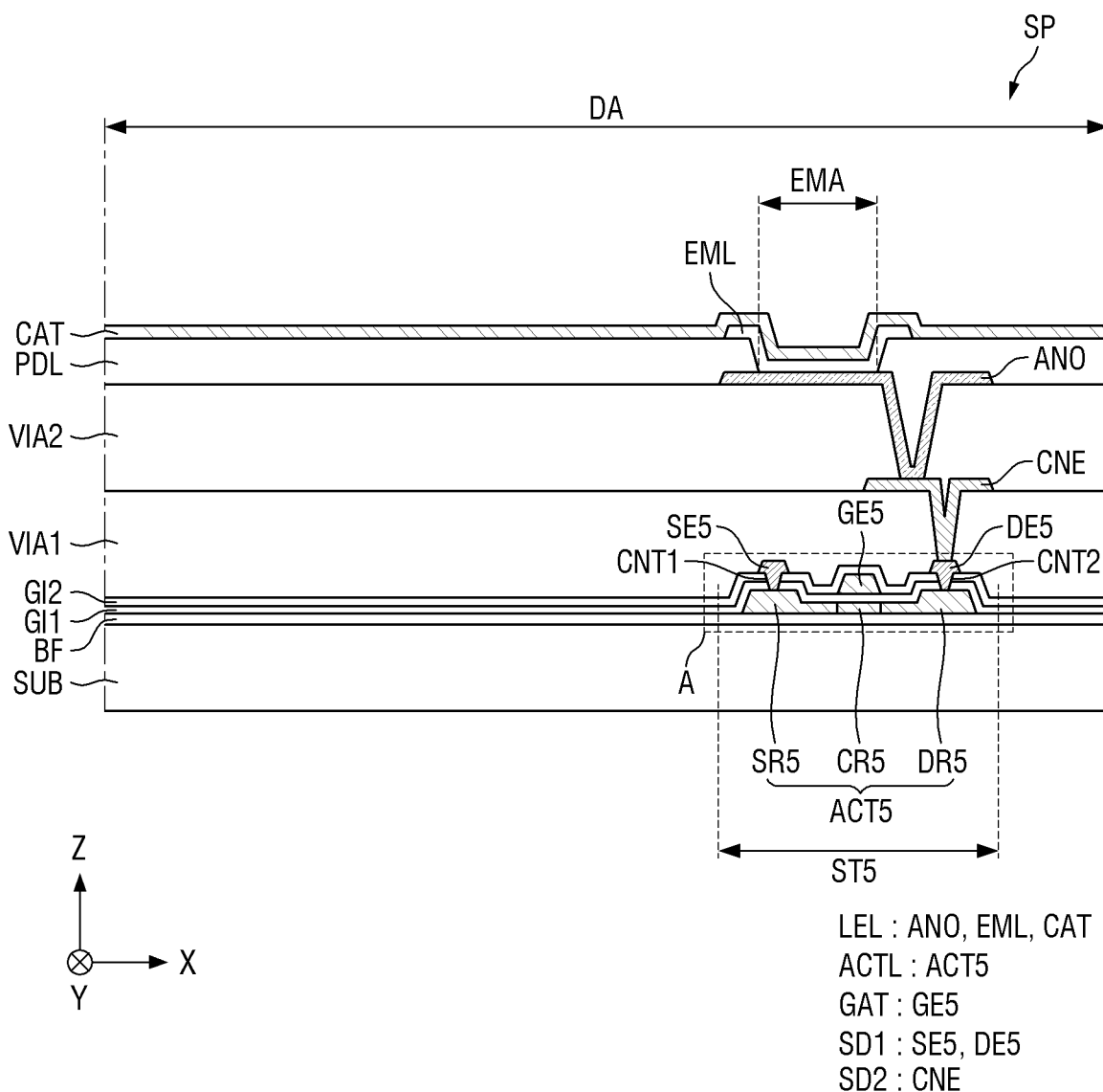
FIG. 4 is a schematic cross-sectional view illustrating a schematic cross section of a sub-pixel disposed in a display area according to an embodiment.
Figure 5:
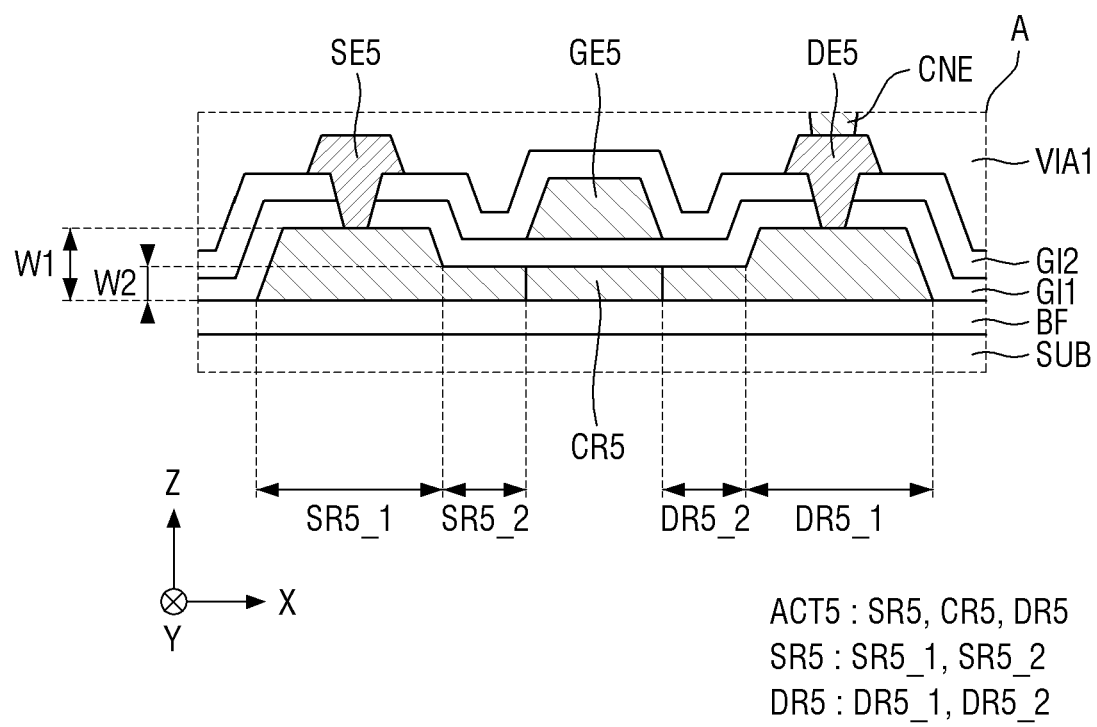
FIG. 5 is a schematic enlarged view of area A of FIG. 4.

FIG. 4 is a cross-sectional view illustrating a schematic cross section of a sub-pixel SP disposed in a display area according to an embodiment. FIG. 5 is an enlarged view of area A of FIG. 4.

Referring to FIGS. 4 and 5, the display panel 100 according to an embodiment may be a structure in which a substrate SUB, a buffer layer BF, a semiconductor layer ACTL, a first gate insulating layer GI1, a gate conductive layer GAT, a second gate insulating layer GI2, a first metal conductive layer SD1, a first via insulating layer VIA1, a second metal conductive layer SD2, a second via insulating layer VIA2, a pixel defining layer PDL, and the light emitting element LEL are sequentially stacked on each other in the third direction Z. Each of the above-described layers may be formed of a single layer, but may also be formed of a multilayer in which multiple layers identical to each other or different from each other are stacked on each other. For simplicity of description, FIG. 4 illustrates only the fifth thin film transistor ST5 among the multiple thin film transistors described above in conjunction with FIG. 3.

The substrate SUB may serve as the base of the display panel 100. In case that the substrate SUB may be a flexible substrate SUB having flexibility, the substrate SUB may include polyimide, but the disclosure is not limited thereto. Further, in case that the substrate SUB may be a rigid substrate SUB having rigidity, the substrate SUB may include glass, but the disclosure is not limited thereto. Hereinafter, for simplicity of description, the case where the substrate SUB may be the flexible substrate SUB having flexibility and includes polyimide will be mainly described.

The buffer layer BF may serve to prevent diffusion of metal atoms or impurities from the substrate SUB to the semiconductor layer ACTL. The buffer layer BF may be disposed on the entire substrate SUB. The buffer layer BF may include an inorganic insulating material ($SiO_xN_y$).

The semiconductor layer ACTL may be positioned on (e.g., positioned directly on) a surface of the buffer layer BF. Specifically, the semiconductor layer ACTL may be in direct contact with a surface of the buffer layer BF. The semiconductor layer ACTL may be selectively patterned and disposed on the buffer layer BF.

The semiconductor layer ACTL may include active layers of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 described above in conjunction with FIG. 3. The active layer may include a channel region, a source region, and a drain region of each of the first thin film transistor ST1, the second thin film transistor ST2, the third thin film transistor ST3, the fourth thin film transistor ST4, the fifth thin film transistor ST5, the sixth thin film transistor ST6, the seventh thin film transistor ST7, or a combination thereof. For example, as shown in FIG. 4, the fifth thin film transistor ST5 may include a fifth active layer ACT5. The fifth active layer ACT5 may include a fifth channel region CR5 overlapped or covered by a fifth gate electrode GE5 in a plan view which will be described later, a fifth source region SR5 located on a side of the fifth channel region CR5, a fifth drain region DR5 located on another side of the fifth channel region CR5, or a combination thereof.

Referring to FIG. 5, the fifth source region SR5 of the fifth active layer ACT5 may include a first sub-source region SR5_1, a second sub-source region SR5_2, or a combination thereof. The fifth drain region DR5 may include a first sub-drain region DR5_1, a second sub-drain region DR5_2, or a combination thereof.

The first sub-source region SR5_1 and the second sub-source region SR5_2 may be disposed at a side of the fifth channel region CR5. Specifically, the first sub-source region SR5_1 may be disposed at a side of the fifth channel region CR5 while being spaced apart from the fifth channel region CR5 in the first direction X with the second sub-source region SR5_2 disposed therebetween. The second sub-source region SR5_2 may be disposed between the first sub-source region SR5_1 and the fifth channel region CR5 while being in contact with a side of the fifth channel region CR5.

A thickness W1 of the first sub-source region SR5_1 in the third direction Z may be larger than a thickness W2 of the second sub-source region SR5_2 in the third direction Z. The thickness W2 of the second sub-source region SR5_2 in the third direction Z may be substantially a same as the thickness of the fifth channel region CR5. In other words, the thickness W1 of the first sub-source region SR5_1 in the third direction Z may be larger than the thickness of the fifth channel region CR5. Accordingly, the top surface of the second sub-source region SR5_2 and the top surface of the fifth channel region CR5 may be flat, and the top surface of the first sub-source region SR5_1 may be located higher than the top surface of the second sub-source region SR5_2 and the top surface of the fifth channel region CR5.

The fifth drain region DR5 of the fifth active layer ACT5 may be disposed on another side of the fifth channel region CR5 while being spaced apart from the fifth source region SR5 in the first direction X with the fifth channel region CR5 disposed therebetween. In other words, the fifth source region SR5 and the fifth drain region DR5 may be symmetrically disposed in the first direction X with respect to the fifth channel region CR5.

The fifth drain region DR5 of the fifth active layer ACT5 may include a first sub-drain region DR5_1, a second sub-drain region DR5_2, or a combination thereof.

Specifically, the first sub-drain region DR5_1 may be disposed at another side of the fifth channel region CR5 while being spaced apart from the fifth channel region CR5 in the first direction X with the second sub-drain region DR5_2 disposed therebetween. The second sub-drain region DR5_2 may be disposed between the first sub-drain region DR5_1 and the fifth channel region CR5 while being in contact with another side of the fifth channel region CR5.

In an embodiment, the thickness W1 of the first sub-source region SR5_1 may be substantially a same as the thickness W1 of the first sub-drain region DR5_1, and the thickness W2 of the second sub-source region SR5_2 may be substantially a same as the thickness W2 of the second sub-drain regions DR5_2.

Accordingly, the thickness W1 of the first sub-drain region DR5_1 in the third direction Z may be larger than the thickness W2 of the second sub-drain region DR5_2 in the third direction Z. The thickness W2 of the second sub-drain region DR5_2 in the third direction Z may be substantially a same as the thickness of the fifth channel region CR5. In other words, the thickness W1 of the first sub-drain region DR5_1 in the third direction Z may be larger than the thickness of the fifth channel region CR5. Accordingly, the top surface of the second sub-drain region DR5_2 of the fifth drain region DR5 and the top surface of the fifth channel region CR5 may be flat, and the top surface of the first sub-drain region DR5_1 of the fifth drain region DR5 may be located higher than the top surface of the second sub-drain region DR5_2 thereof and the top surface of the fifth channel region CR5.

However, the disclosure is not limited thereto. In some embodiments, the first sub-source region SR5_1 and the first sub-drain region DR5_1 may have thicknesses larger than the thickness of the fifth channel region CR5, and the thickness of the first sub-source region SR5_1 may be different from the thickness of the first sub-drain region DR5_1.

Although the fifth thin film transistor ST5 has been mainly described with reference to FIGS. 4 and 5, the structures of the first thin film transistor ST1, the second thin film transistor ST2, the third thin film transistor ST3, the fourth thin film transistor ST4, the sixth thin film transistor ST6, and the seventh thin film transistor ST7 described above in conjunction with FIG. 3 may have a structure similar to that of the fifth thin film transistor ST5. However, the disclosure is not limited thereto.

The first gate insulating layer GI1 may be disposed on the semiconductor layer ACTL. The first gate insulating layer GI1 may cover not only the top surface of the semiconductor layer ACTL except for the portions where a first contact hole CNT1 and a second contact hole CNT2 are formed, but also the side surface of the semiconductor layer ACTL. The first gate insulating layer GI1 may be disposed substantially over the entire surface of the substrate SUB.

However, the disclosure is not limited thereto. In some embodiments, the first gate insulating layer GI1 may be disposed only in a portion of the fifth channel region CR5 of the fifth active layer ACT5 overlapped or covered by a fifth gate electrode GE5 in a plan view and between the fifth channel region CR5 and the fifth gate electrode GE5, which will be described later in conjunction with FIG. 27.

The first gate insulating layer GI1 may include a silicon compound, a metal oxide, the like, or a combination thereof. For example, the first gate insulating layer GI1 may contain silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), or the like. The first gate insulating layer GI1 may have a single-layer structure made of materials or a multi-layer structure made of two or more layers.

The gate conductive layer GAT may be disposed on the first gate insulating layer GI1. The gate conductive layer GAT may include the gate electrodes of the first thin film transistor ST1, the second thin film transistor ST2, the third thin film transistor ST3, the fourth thin film transistor ST4, the fifth thin film transistor ST5, the sixth thin film transistor ST6, the seventh thin film transistor ST7, or a combination thereof as described above in connection with FIG. 3. For example, the gate conductive layer GAT may include the gate electrode GE5 of the fifth thin film transistor ST5 as shown in FIG. 4.

Referring to FIGS. 4 and 5, the fifth gate electrode GE5 may be disposed to overlap or cover the fifth channel region CR5 of the fifth active layer ACT5 in the third direction Z, and may not overlap or cover the fifth source region SR5 and the fifth drain region DR5 of the fifth active layer ACT.

The gate conductive layer GAT may include a metal. For example, the fifth gate conductive layer GAT5 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and a combination thereof.

The second gate insulating layer GI2 may be disposed on the gate conductive layer GAT. The second gate insulating layer GI2 may cover not only the top surface of the gate conductive layer GAT except for the portions where the first contact hole CNT1 and the second contact hole CNT2 are formed, but also the side surface of the gate conductive layer GAT. The second gate insulating layer GI2 may be disposed substantially over the entire surface of the substrate SUB.

The second gate insulating layer GI2 may include a silicon compound, a metal oxide, the like, or a combination thereof. For example, the second gate insulating layer GI2 may contain silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), or the like. The second gate insulating layer GI2 may have a single-layer structure made of materials or a multi-layer structure made of two or more layers.

The first metal conductive layer SD1 may be disposed on the second gate insulating layer GI2. The first metal conductive layer SD1 may include the source electrodes and the drain electrodes of the first thin film transistor ST1, the second thin film transistor ST2, the third thin film transistor ST3, the fourth thin film transistor ST4, the fifth thin film transistor ST5, the sixth thin film transistor ST6, the seventh thin film transistor ST7, or a combination thereof described above in conjunction with FIG. 3. For example, the first metal conductive layer SD1 may include a fifth source electrode SE5, a fifth drain electrode DE5, or a combination thereof of the fifth thin film transistor ST5 as shown in FIG. 4.

In case that the first metal conductive layer SD1 is disposed to form the source electrodes and the drain electrodes on the second gate insulating layer GI2, the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 may be defined. For example, as shown in FIG. 4, a fifth source electrode SE5 and a fifth drain electrode DE5 may be electrically connected to the fifth source region SR5 and the fifth drain region DR5 of the fifth active layer ACT5, respectively, through the first contact hole CNT1 and the second contact hole CNT2 that are formed to penetrate the first gate insulating layer GI1 and the second gate insulating layer GI2.

The first metal conductive layer SD1 may include a metal. For example, the first metal conductive layer SD1 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) copper (Cu), and a combination thereof. In some embodiments, the first metal conductive layer SD1 may have a multilayer structure. For example, the first metal conductive layer SD1 may have a two-layer structure of Ti/Al or a three-layer structure of Ti/Al/Ti.

The first via insulating layer VIA1 may serve to partially insulate the first metal conductive layer SD1 from the second metal conductive layer SD2 to be described later, and flatten a stepped portion formed by the element of the fifth thin film transistor ST5. The first via insulating layer VIA1 may be disposed on the second gate insulating layer GI2 on which the first metal conductive layer SD1 may be formed. The first via insulating layer VIA1 may be made of an organic insulating material such as an acrylic resin, a polyimide-based resin, a polyamide-based resin, or the like.

The second metal conductive layer SD2 may be disposed on the first via insulating layer VIA1. The second metal conductive layer SD2 may include a connection electrode CNE, an initialization voltage line, the like, or a combination thereof that are electrically connected to the source electrodes or the drain electrodes of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 described above in connection with FIG. 3. For example, the second metal conductive layer SD2 may include a connection electrode CNE electrically connected to the fifth drain electrode DE5 as shown in FIG. 4. The connection electrode CNE may be electrically connected to the fifth drain electrode DE5 through a contact hole penetrating the first via insulating layer VIA1.

The second metal conductive layer SD2 may include a metal. For example, the second metal conductive layer SD2 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) copper (Cu) and a combination thereof. In some embodiments, the second metal conductive layer SD2 may have a multilayer structure. For example, the second metal conductive layer SD2 may have a two-layer structure of Ti/Al or a three-layer structure of Ti/Al/Ti.

The second via insulating layer VIA2 may be disposed on the first via insulating layer VIA1 on which the second metal conductive layer SD2 may be formed. The second via insulating layer VIA2 may be made of an organic insulating material such as an acrylic resin, a polyimide-based resin, a polyamide-based resin, or the like. A surface of the second via insulating layer VIA2 in the third direction Z may be the top surface on which the pixel defining layer PDL may be disposed, and another surface of the second via insulating layer VIA2 in the third direction Z may be the bottom surface on which the first via insulating layer VIA1 is disposed.

The light emitting element LEL may include an anode electrode ANO, a light emitting layer EML, a cathode electrode CAT, or a combination thereof, and may be disposed on the second via insulating layer VIA2.

The anode electrode ANO of the light emitting element LEL may be electrically connected to the connection electrode CNE through a contact hole penetrating the second via insulating layer VIA2, and may be electrically connected to the fifth drain electrode DE5 of the fifth thin film transistor ST5 as shown in FIG. 4.

The pixel defining layer PDL may be disposed on the second via insulating layer VIA2 on which the anode electrode ANO is disposed. The pixel defining layer PDL may be made of an organic material such as an acrylic resin, a polyimide resin, or the like. The pixel defining layer PDL may form an opening partially exposing the anode electrode. An emission area EMA of the light emitting layer EML may be defined by the opening.

The light emitting layer EML may be disposed on the anode electrode ANO and the pixel defining layer PDL. In case that the light emitting layer EML is an organic light emitting layer containing an organic material, the light emitting element LEL may be an organic light emitting diode. In case that the light emitting layer EML includes a quantum dot light emitting layer, the light emitting element LEL may be a quantum dot light emitting element. In case that the light emitting layer EML includes an inorganic semiconductor, the light emitting element LEL may be an inorganic light emitting element. As another example, the light emitting element LEL may be a micro light emitting diode.

The cathode electrode CAT may be disposed on the light emitting layer EML. The cathode electrode CAT may cover the entire pixel defining layer PDL on which the light emitting layer EML is formed. In other words, the cathode electrode CAT may be formed to have substantially a same thickness in the profile of the pixel defining layer PDL on which the light emitting layer EML is formed.

Although not shown in FIG. 4, a thin film encapsulation layer may be further disposed on the light emitting element LEL. The thin film encapsulation layer may serve to prevent external moisture and oxygen from permeating the light emitting element LEL.

Although not shown in FIG. 4, a touch sensor layer may be additionally disposed on the thin film encapsulation layer. The touch sensor layer may serve to sense a touch input applied to the display device 10. The touch sensor layer may have a structure in which a conductive layer and an insulating layer are sequentially stacked on each other. The conductive layer of the touch sensor layer may have a mesh-type shape in plan view.

Figure 6:
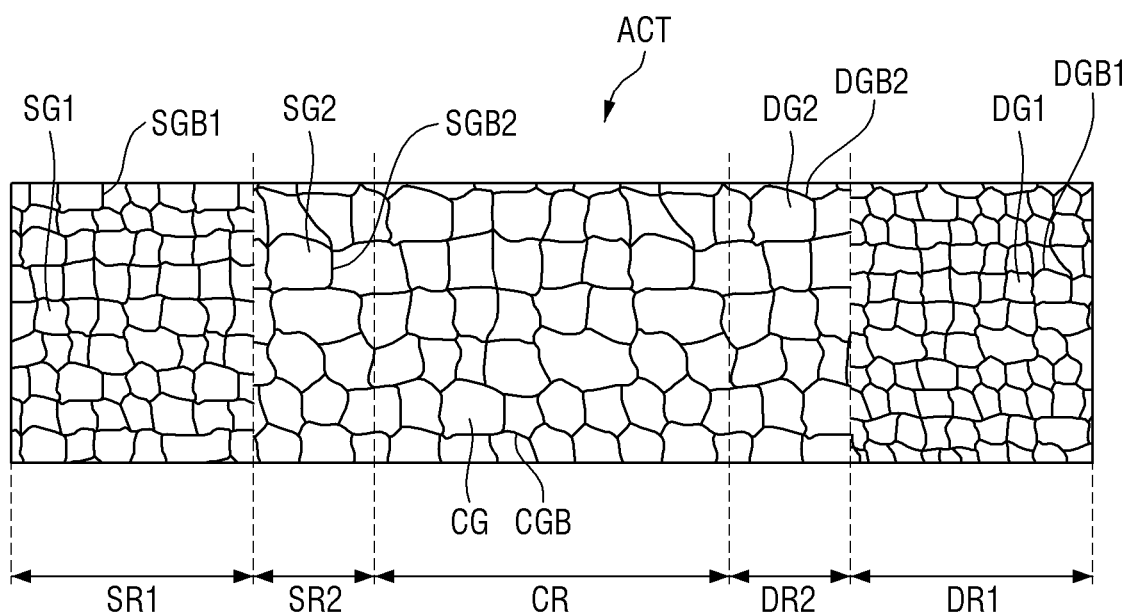
FIG. 6 is a schematic diagram illustrating grains included in an active layer of a thin film transistor according to an embodiment.

FIG. 6 is a schematic diagram illustrating grains included in an active layer of a thin film transistor according to an embodiment.

Referring to FIG. 6, a source region SR, a channel region CR, and a drain region DR of the active layer ACT, which may be included in the thin film transistor ST according to an embodiment, may include multiple grains GR having different sizes and grain boundaries GB that define the multiple grains GR. The multiple grains GR may be arranged randomly in a plan view. The size of the grain GR refers to the width of the grain GR in a plan view, and may be a distance between the adjacent grain boundaries GB.

In case that a laser beam is irradiated onto an amorphous silicon layer in a solid state in a process of forming the active layer ACT, the amorphous silicon layer may absorb heat and change into a liquid state, and may emit heat and change back into a solid state. A crystal may be grown from a crystal seed, thereby forming the grain GR. If there is a difference in a cooling rate in the process of changing the amorphous silicon layer from the liquid state to the solid state, the grain boundary GB may be formed in a region with a slow cooling rate because the grain GR grows from a region with a fast cooling rate toward a region with a slow cooling rate.

In the process of forming the active layer ACT, the size of the grain GR included in the active layer ACT may be determined according to the thickness of the amorphous silicon layer, a wavelength of a laser beam irradiated to the amorphous silicon layer, a scan pitch, an energy density, and the like.

Specifically, the source region SR may include a first sub-source region grain SG1 included in a first sub-source region SR1, a second sub-source region grain SG2 included in a second sub-source region SR2, or a combination thereof. The channel region CR may include a channel region grain CG. The drain region DR may include a first sub-drain region grain DG1 included in a first sub-drain region DR1, a second sub-drain region grain DG2 included in a second sub-drain region DR2, or a combination thereof.

As shown in FIG. 6, the first sub-source region grain SG1 and the first sub-drain region grain DG1 may have a same size, and the second sub-source region grain SG2 and the channel region grain CG, and the second sub-drain region grain DG2 may have a same size. The first sub-source region grain SG1 and the first sub-drain region grain DG1 may be smaller than the second sub-source region grain SG2, the channel region grain CG, and the second sub-drain region grain DG2.

A grain boundary SGB1 of the first sub-source region and a grain boundary DGB1 of the first sub-drain region may have a same density. A grain boundary SGB2 of the second sub-source region, a grain boundary CGB of the channel region, and a grain boundary DGB2 of the second sub-drain region may have a same density.

The grain boundary density SGB1 of the first sub-source region SR1 and the grain boundary density DGB1 of the first sub-drain region DR1 may be greater than the grain boundary density SGB2 of the second sub-source region SR2, the grain boundary density CGB of the channel region CR, and the grain boundary density DGB2 of the second sub-drain region DR2.

This is because a difference in grain boundary density GB may occur due to a difference in the size of the grain GR included in each region of the active layer ACT. In other words, in the active layer ACT, since the sizes of the first sub-source region grain SG1 and the first sub-drain region grain DG1 included in the first sub-source region SR1 and the first sub-drain region DR1 respectively are smaller than the sizes of the second sub-source region grain SG2, the channel region grain CG, and the second sub-drain region grain DG2 included in the second sub-source region SR2, the channel region CR, and the second sub-drain region DR2 respectively, the grain boundary density SGB1 of the first sub-source region and the grain boundary density DGB1 of the first sub-drain region DR1, which define the first sub-source region grain SG1 and the first sub-drain region grain DG1, respectively, may be greater than the grain boundary density SGB2 of the second sub-source region SR2, the grain boundary density CGB of the channel region CR, and the grain boundary density DGB2 of the second sub-drain region DR2.

Here, the grain boundary density GB may indicate how densely the grain boundaries GB are contained in each region of the active layer ACT. In other words, the grain boundary density GB may indicate the number of the grain boundaries GB included per unit area of each region of the active layer ACT.

As such, the sizes of the grains GR included in the respective regions of the active layer ACT are different and the densities of the grain boundaries GB defining them are different because, in case that a laser beam is irradiated to the respective regions of the solid-state amorphous silicon layer which have different thicknesses, in the process of forming the active layer ACT, the degree of energy absorption may vary due to the thickness difference, and this may result in different temperatures in the respective regions.

Accordingly, while the amorphous silicon layer may be changed from a liquid state to a solid state, a difference in the size of the grains GR may occur, and accordingly a difference in grain boundary density GB may occur. For example, in the process of forming the active layer ACT, the amorphous silicon layer included in the first sub-source region SR1 may have a relatively large thickness compared to the amorphous silicon layer included in the second sub-source region SR2 and the amorphous silicon layer included in the channel region CR. In case that a laser beam having a same wavelength is applied to the amorphous silicon layer included in the first sub-source region SR1, the amorphous silicon layer included in the second sub-source region SR2, and the amorphous silicon layer included in the channel region CR, the amorphous silicon layer included in the first sub-source region SR1 having the relatively large thickness may have a relatively low temperature because its energy absorption rate of the laser beam may be relatively low compared to the amorphous silicon layer included in the second sub-source region SR2 and the amorphous silicon layer included in the channel region CR.

Therefore, while the amorphous silicon layer included in the first sub-source region SR1 may be changed from the liquid state to the solid state, its cooling rate may be faster than those of the amorphous silicon layer included in the second sub-source region SR2 and the amorphous silicon layer included in the channel region CR, and thus the size of the first sub-source region grain SG1 formed in the first sub-source region SR1 may be smaller than the sizes of the second sub-source region grain SG2 and the channel region grain CG formed in the second sub-source region SR2 and the channel region CR respectively. Accordingly, the grain boundary density SGB1 formed in the first sub-source region SR1 may be greater than the grain boundary density SGB2 and the grain boundary density CGB that are formed in the second sub-source region SR2 and the channel region CR respectively.

Figure 7:
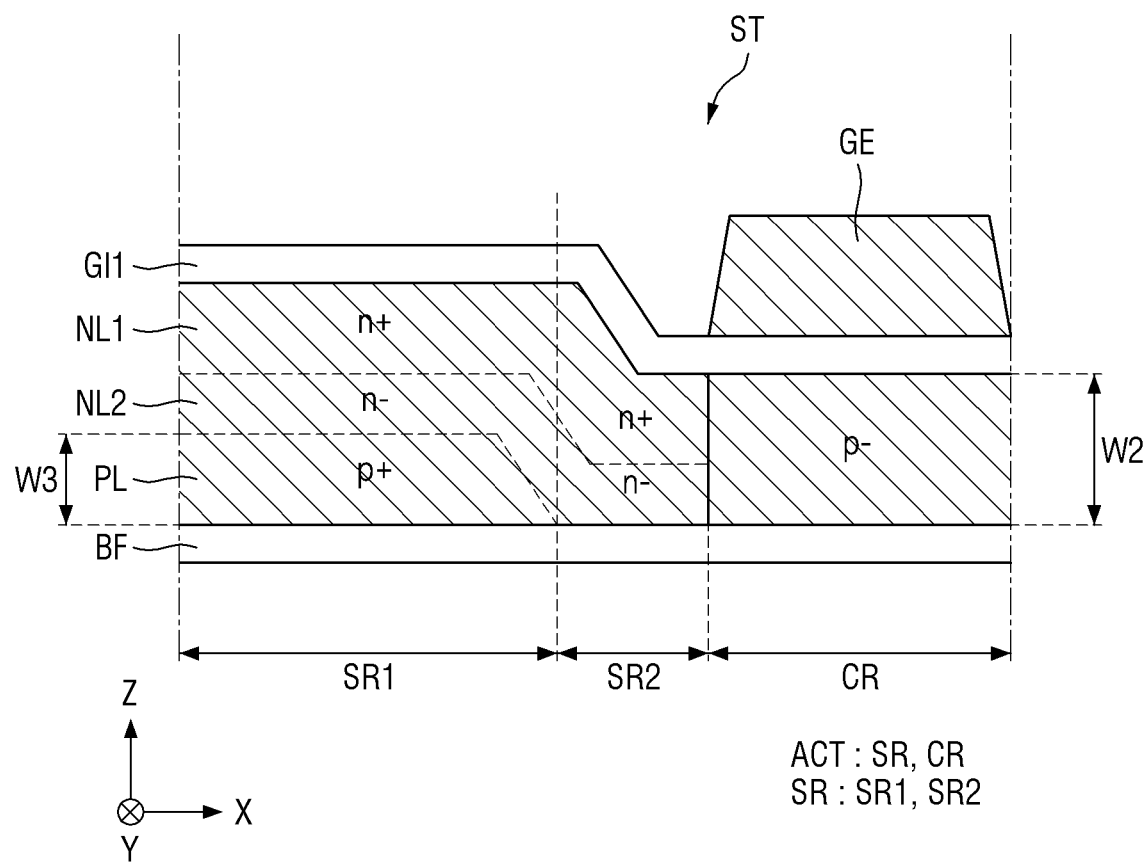
FIG. 7 is a schematic cross-sectional view illustrating a part of an active layer of a thin film transistor according to an embodiment.

FIG. 7 is a cross-sectional view illustrating a part of an active layer of a thin film transistor according to an embodiment.

FIG. 7 is a view showing doped layers included in the source region SR and the channel region CR of the active layer ACT according to an embodiment. Although not shown in FIG. 7, doped layers included in the drain region DR may be symmetrical to those of the source region SR. In other words, the types and the arrangement of the doped layers included in the drain region DR may be a same as those of the doped layers in the source region SR. Hereinafter, dopants and doped layers included in the source region SR and the channel region CR of the active layer ACT will be described.

In FIG. 7, '+' indicates a state in which dopants included in each doped layer are doped at a relatively high concentration, and '−' indicates a state in which dopants included in each doped layer are doped at a relatively low concentration.

Referring to FIG. 7, the source region SR of the active layer ACT may include a p-type doped layer PL, in which a p-type dopant concentration may be higher than an n-type dopant concentration, a first n-type doped layer NL1, in which an n-type dopant concentration may be higher than a p-type dopant concentration, a second n-type doped layer NL2, in which an n-type dopant concentration may be higher than a p-type dopant concentration and the n-type dopant concentration may be lower than that of the first n-type doped layer NL1.

In other words, the p-type doped layer PL, the first n-type doped layer NL1, and the second n-type doped layer NL2 may include different ratios of the p-type dopant to the n-type dopant. Each doped layer may be defined by a dopant at a higher concentration between the p-type dopant and the n-type dopant.

For example, in the p-type doped layer PL, since the p-type dopant concentration may be higher than the n-type dopant concentration, it may be defined as the p-type doped layer PL doped with p+. In the first n-type doped layer NL1, since the n-type dopant concentration may be higher than the p-type dopant concentration, it may be defined as the first n-type doped layer NL1 doped with n+. In the second n-type doped layer NL2, the n-type dopant concentration may be higher than the p-type dopant concentration like the first n-type doped layer NL1, but the n-type dopant concentration may be relatively low compared to that of the first n-type doped layer NL1, so that it may be defined as the second n-type doped layer NL2 doped with n−.

Specifically, the p-type doped layer PL may be disposed at a lower region of the first sub-source region SR1 while being in contact with the buffer layer BF.

The first n-type doped layer NL1 may be disposed at upper regions of the first sub-source region SR1 and the second sub-source region SR2 while being in contact with the first gate insulating layer GI1.

The second n-type doped layer NL2 may be located between the p-type doped layer PL and the first n-type doped layer NL1 in the first sub-source region SR1, and may also be disposed at a lower region of the second sub-source region SR2 while being in contact with the buffer layer BF. In other words, a portion of the second n-type doped layer NL2 in the first sub-source region SR1 may be formed in the boundary region between the p-type doped layer PL and the first n-type doped layer NL1 while the p-type doped layer PL and the first n-type doped layer NL1 are doped at different doping depths.

Here, the doping depth refers to a distance from the top surface of the active layer ACT throughout a region in which a first dopant or a second dopant may be doped at a highest concentration.

Accordingly, the p-type doped layer PL may be disposed only in the first sub-source region SR1, and the first n-type doped layer NL1 and the second n-type doped layer NL2 may be disposed in both the first sub-source region SR1 and the second sub-source region SR2.

In an embodiment, a thickness W3 of the p-type doped layer PL may be substantially a same thickness as the first n-type doped layer NL1, and may be greater than the thickness of the second n-type doped layer NL2.

Also, the thickness W3 of the p-type doped layer PL may be smaller than a thickness W2 of the channel region CR of the active layer ACT. In case that the thickness W3 of the p-type doped layer PL is smaller than the thickness W2 of the channel region CR, in the process of doping the p-type dopant into the lower region of the first sub-source region SR1, it may be possible to prevent the first dopant from being doped at a higher concentration than the second dopant in the lower region of the second sub-source region SR2. However, the disclosure is not limited thereto.

The channel region CR of the active layer ACT may include a p-type doped layer doped with p−, and the concentration of the p-type dopant included in the channel region CR may be lower than the concentration of the p-type dopant included in the p-type doped layer PL of the first sub-source region SR1. However, since a gate electrode GE serves as a mask in the process of doping the n-type dopant, the channel region CR may not be doped with the n-type dopant unlike the p-type doped layer PL included in the source region SR. Therefore, the channel region CR may not include the n-type dopant. A detailed description thereof will be given later with reference to FIG. 21.

In an embodiment, the n-type dopant may be any one of phosphorus (P), arsenic (As), antimony (Sb), bismuth (Bi), or a combination thereof, and the p-type dopant may be any one of boron (B), aluminum (Al), gallium (Ga) indium (In), or a combination thereof. However, the disclosure is not limited thereto.

Accordingly, the p-type doped layer PL located at the lower region of the first sub-source region SR1 and doped with p+, the second n-type doped layer NL2 located at the lower region of the second sub-source region SR2 and doped with n−, and the channel region CR doped with p− are sequentially disposed in the first direction X with respect to the lower region of active layer ACT and starting from the first sub-source region SR1. Consequently, the lower region of the active layer ACT may be sequentially doped with p+, n−, and p− in the first direction X starting from the lower region of the first sub-source region SR1 to have a bipolar structure.

Accordingly, holes (or carriers) generated in the channel region CR may move to the first sub-source region SR1, and holes that have moved to the first sub-source region SR1 may be dissipated at the grain boundary GB included in the first sub-source region SR1. This is because as described above with reference to FIG. 6, since the grain boundary density GB of the first sub-source region SR1 may be higher than the grain boundary density GB in each of the channel region CR and the second sub-source region SR2, the holes (or carriers) moved to the first sub-source region SR1 having a high grain boundary density GB may be dissipated by being combined with electrons, which are generated at the first n-type doped layer NL1 located in the upper region of the first sub-source region SR1 and at the grain boundaries GB. Accordingly, it may be possible to reduce or prevent the threshold voltage shift of the thin film transistor ST due to the floating body effect by dissipating the holes (carriers) that accumulate in the channel region CR.

Figure 8:
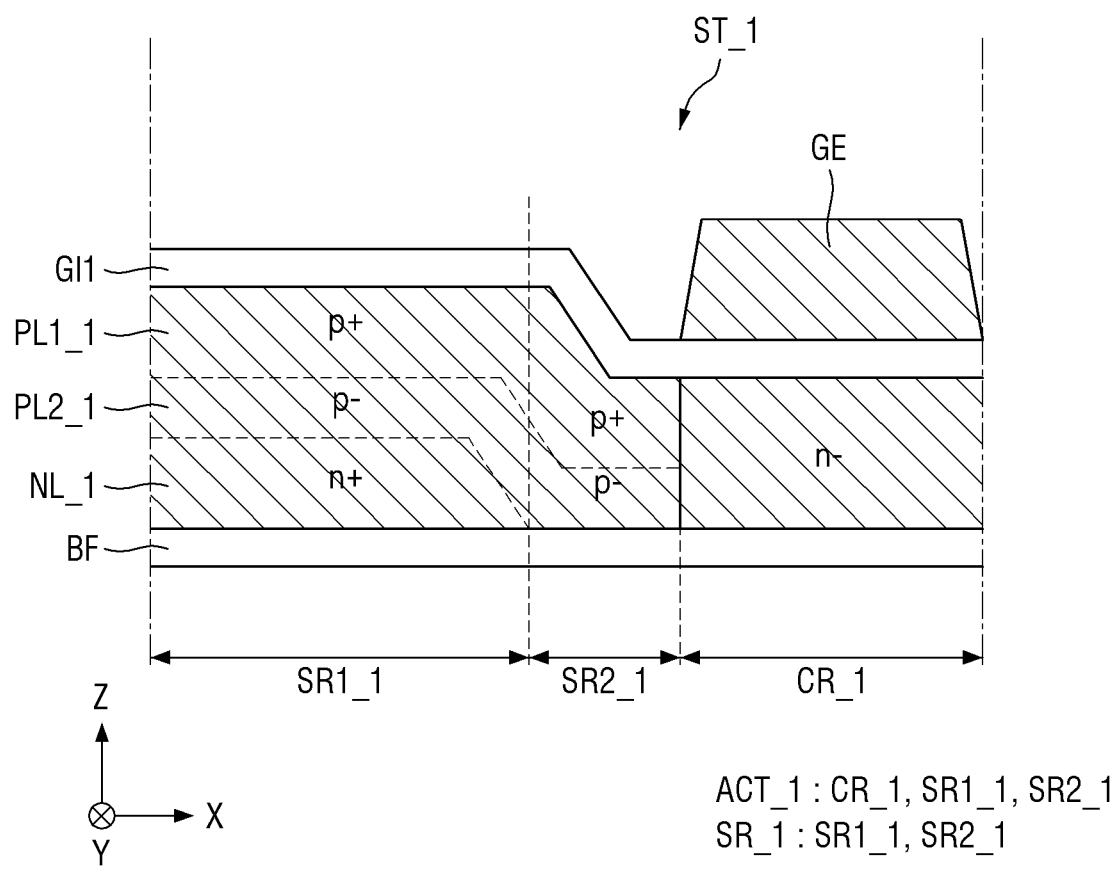
FIG. 8 is a schematic cross-sectional view illustrating a part of an active layer of a thin film transistor according to an embodiment.

FIG. 8 is a cross-sectional view illustrating a part of an active layer of a thin film transistor according to an embodiment.

Referring to FIG. 8, doped layers included in a thin film transistor ST_1 according to the embodiment are different from the doped layers included in the thin film transistor ST according to the embodiment of FIG. 7 in that they have an inverted type. Specifically, an n-type doped layer NL_1 doped with n+ may be disposed in a lower region of a first sub-source region SR1_1 while being in contact with the first buffer layer BF, and a first p-type doped layer PL1_1 doped with p+ may be disposed in upper regions of the first sub-source region SR1_1 and a second sub-source region SR2_1 while being in contact with the first gate insulating layer GIl Further, a second p-type doped layer PL2_1 doped with p− may be disposed in both the first sub-source region SR1_1 and the second sub-source region SR2_1 while being located between the n-type doped layer NL_1 and the first p-type doped layer PL1_1 in the first sub-source region SR1_1. In other words, the n-type doped layer NL_1 may be disposed only in the first sub-source region SR1, and the first p-type doped layer PL1_1 and the second p-type doped layer PL2_1 may be disposed in both the first sub-source region SR1 and the second sub-source region SR2.

A channel region CR_1 of an active layer ACT_1 may include an n-type doped layer, and the concentration of the n-type dopant included in the channel region CR_1 may be lower than the concentration of the n-type dopant included in the n-type doped layer NL_1 of the first sub-source region SR1_1.

Accordingly, the n-type doped layer NL_1 located at the lower region of the first sub-source region SR1_1 and doped with n+, the second p-type doped layer PL2_1 located at the lower region of the second sub-source region SR2_1 and doped with p−, and the channel region CR_1 doped with n− are sequentially disposed in the first direction X at a lower region of the active layer ACT_1. Consequently, the lower region of the active layer ACT_1 may be sequentially doped with n+, p−, and n− in the first direction X starting from the lower region of the first sub-source region SR1_1 to have a bipolar structure.

Accordingly, electrons (or carriers) generated in the channel region CR_1 may move to the first sub-source region SR1_1, and electrons (or carriers) moved to the first sub-source region SR1_1 having a high grain boundary density GB may be dissipated by being readily combined with holes, which are generated in the first p-type doped layer PL1_1 located at the upper region of the first sub-source region SR1_1 and at the grain boundary GB. Accordingly, it may be possible to obtain a same effect as the embodiment of FIG. 7.

Figure 9:
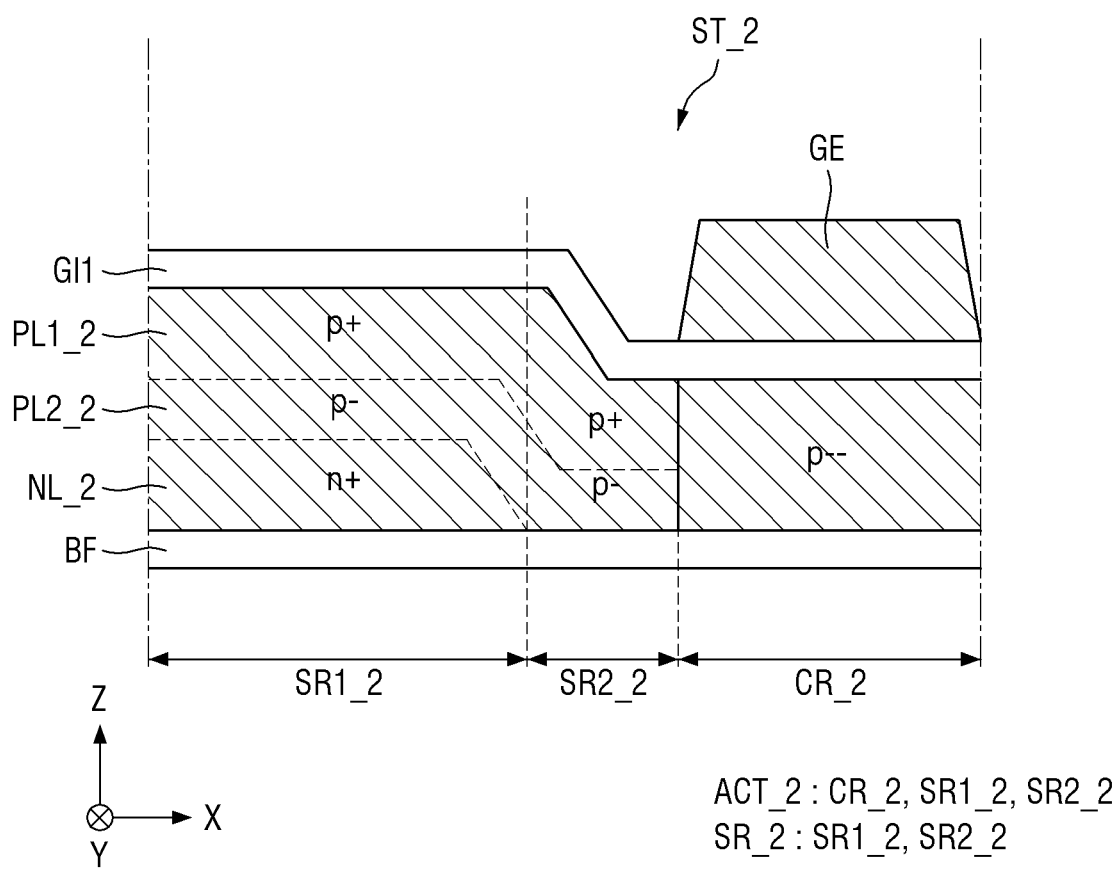
FIG. 9 is a schematic cross-sectional view illustrating a part of an active layer of a thin film transistor according to an embodiment.

FIG. 9 is a cross-sectional view illustrating a part of an active layer of a thin film transistor ST_2 according to an embodiment.

A channel region CR_2 of an active layer ACT_2 according to the embodiment may be different from the channel region CR_1 of the active layer ACTi according to the embodiment shown in FIG. 8 in that it includes a p-type doped layer.

Specifically, the concentration of the p-type dopant included in the channel region CR_2 may be lower than a concentration of a p-type dopant included in a second p-type doped layer PL2_2 located in a first sub-source region SR1_2 and a second sub-source region SR2_2. Since the concentration of the p-type dopant included in the channel region CR_2 may be lower than the concentration of the p-type dopant included in the second p-type doped layer PL2_2, the channel region CR_2 may be characterized as p−−. (First p-type doped layer PL1_2 doped with p+ may be disposed in upper regions of the first sub-source region SR1_2 and the second sub-source region SR2_2 while being in contact with the first gate insulating layer GI1.)

Accordingly, an n-type doped layer NL_2 located at the lower region of the first sub-source region SR1_2 and doped with n+, the second p-type doped layer PL2_2 located at the lower region of the second sub-source region SR2_2 and doped with p−, and the channel region CR_2 doped with p−− are sequentially disposed in the first direction X at the lower region of the first active region ACT_2. Thus the lower region of the active layer ACT_2 may be sequentially doped with n+, p−, and p−− in the first direction X.

Even in this embodiment, since holes (or carriers) generated in the channel region CR_2 may move to the first sub-source region SR1_2, and holes that have moved to the first sub-source region SR1_2 may be dissipated at grain boundaries GB included in the source region SR1_2, it may be possible to obtain a same effect as the embodiments illustrated in FIGS. 7 and 8. Hereinafter, a method of fabricating a display device will be described with further reference to other drawings.

Figure 10:
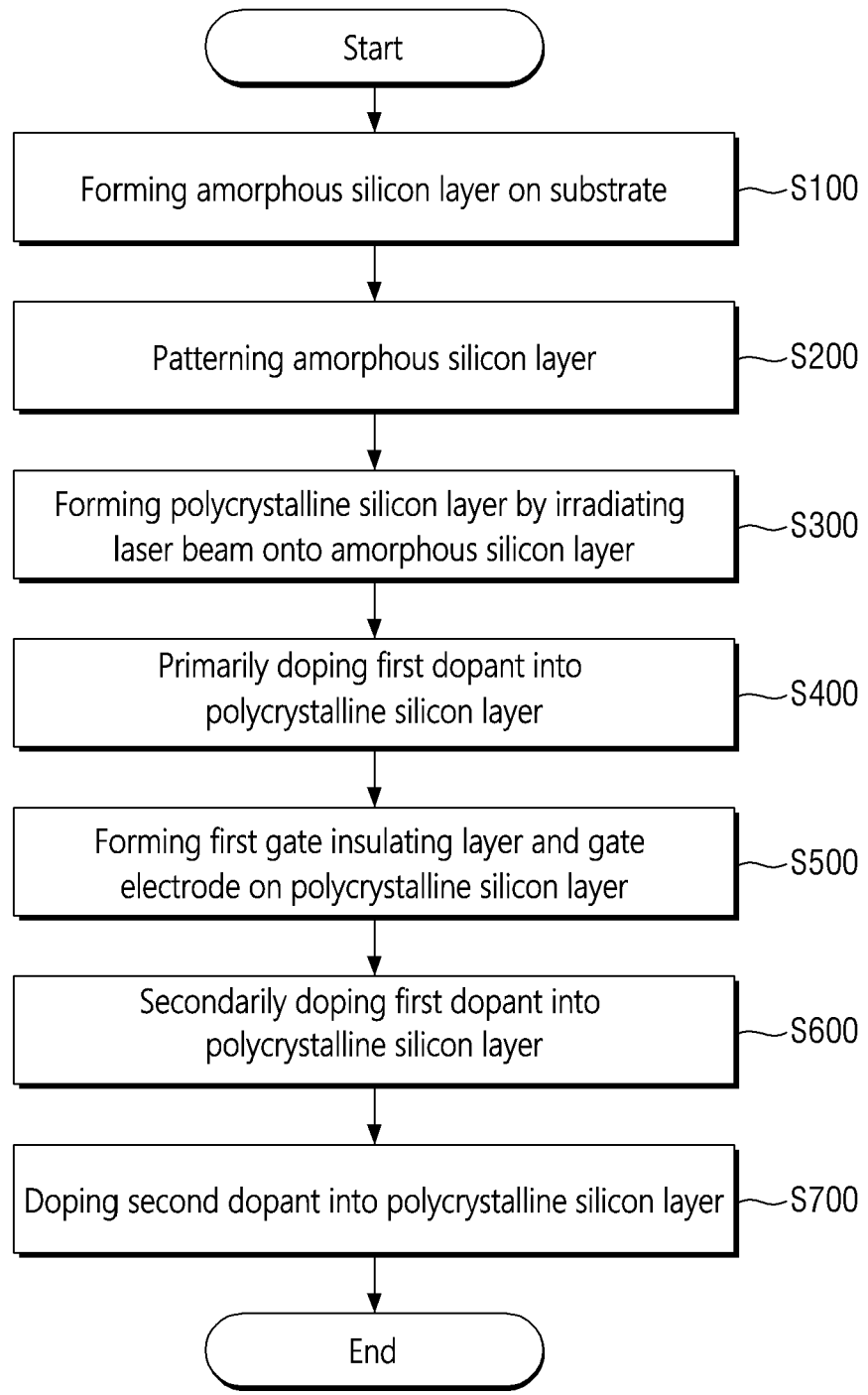
FIG. 10 is a schematic flowchart showing a method of fabricating a display device according to an embodiment.

FIG. 10 is a flowchart showing a method of fabricating a display device according to an embodiment. FIGS. 11 to 22 are schematic diagrams illustrating a method of fabricating a display device according to an embodiment.

Figure 11:
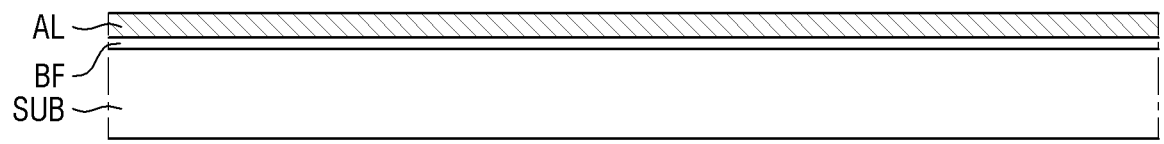
FIGS. 11 to 22 are schematic diagrams illustrating a method of fabricating a display device according to an embodiment.

Referring to FIG. 11, an amorphous silicon layer AL may be formed on a substrate SUB (step S100).

As shown in FIG. 11, the buffer layer BF may be disposed on the substrate SUB. The description of the substrate SUB and the buffer layer BF may be a same as the above description. The amorphous silicon layer AL may be formed by a technique such as low pressure chemical vapor deposition (LPCVD), atmospheric pressure chemical vapor deposition (APCVD), plasma enhanced chemical vapor deposition (PECVD), sputtering, and vacuum deposition. However, the disclosure is not limited thereto.

Referring to FIGS. 12 to 16, the amorphous silicon layer AL may be patterned (step S200).

Figure 12:
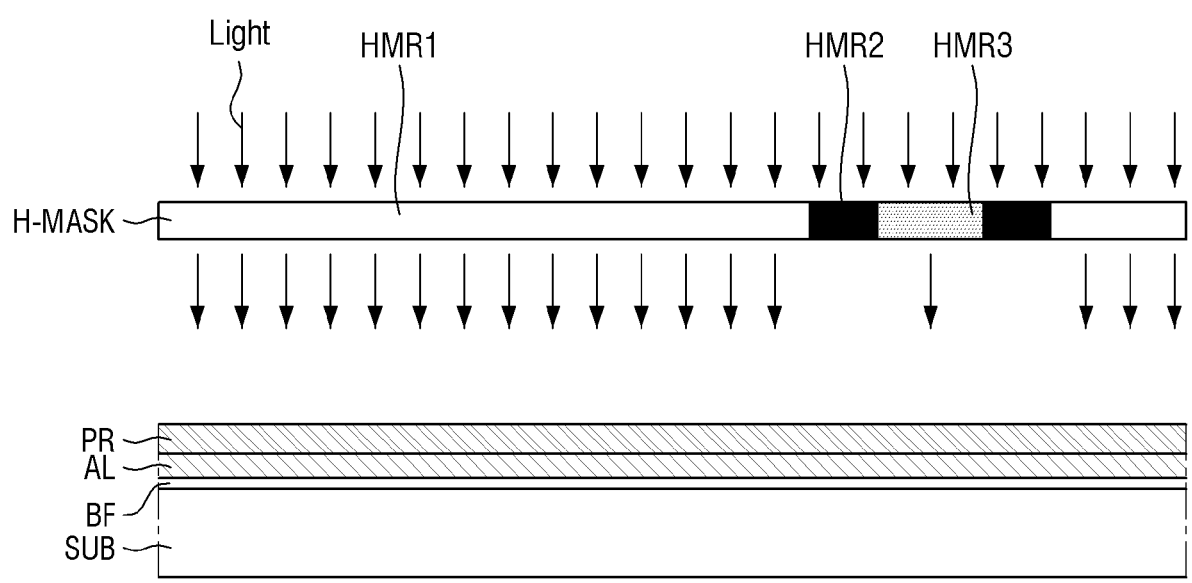

First, as shown in FIG. 12, a photoresist layer PR may be formed on the amorphous silicon layer AL. The photoresist layer PR may be formed of a photosensitive organic material. In an embodiment, the photoresist layer PR may include a positive photosensitive organic material from which a portion exposed to light may be removed. However, the disclosure is not limited thereto. In some embodiments, the photoresist layer PR may include a negative photosensitive organic material in which a portion exposed to light may be cured.

A halftone mask H-MASK may be disposed on the photoresist layer PR, and the photoresist layer PR may be exposed using the halftone mask H-MASK. The halftone mask H-MASK may include a light transmitting portion HMR1, a light blocking portion HMR2, a semi-transmitting portion HMR3, or a combination thereof. The light transmitting portion HMR1 may transmit light, the light blocking portion HMR2 may block light, and the semi-transmitting portion HMR3 may transmit a part of light. As a result, the light transmittance of the semi-transmitting portion HMR3 may be lower than the light transmittance of the light transmitting portion HMR1 and higher than the light transmittance of the light blocking portion HMR2.

Figure 13:
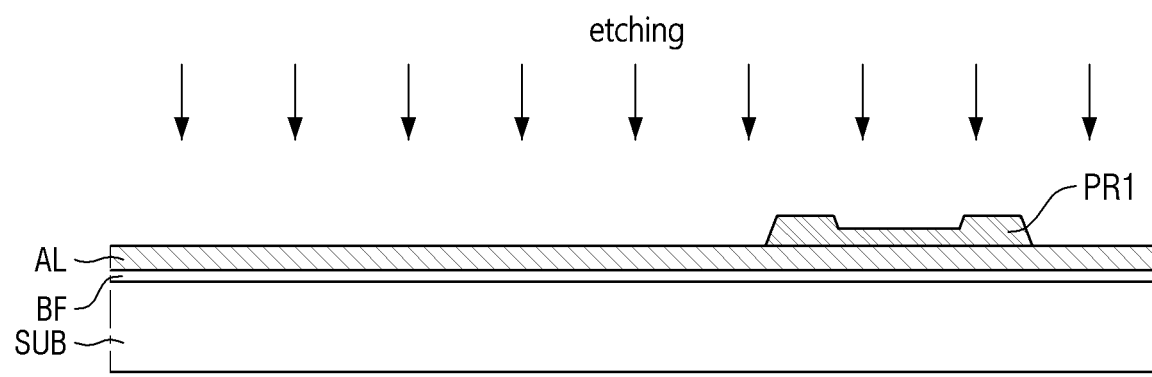

Referring to FIG. 13, the photoresist layer PR that has been irradiated with light through the halftone mask H-MASK may be developed to form a first photoresist pattern PR1. A part of the photoresist layer PR which corresponds to the light transmitting portion HMR1 may be substantially completely removed, and a part of the photoresist layer PR which corresponds to the light blocking portion HMR2 may remain substantially unremoved. A portion of the photoresist layer PR which corresponds to the semi-transmitting portion HMR3, may be partially removed. Accordingly, the first photoresist pattern PR1, in which the portion corresponding to the light blocking portion HMR2 has a larger thickness than a thickness of the portion corresponding to the semi-transmitting portion HMR3, may be formed.

Figure 14:
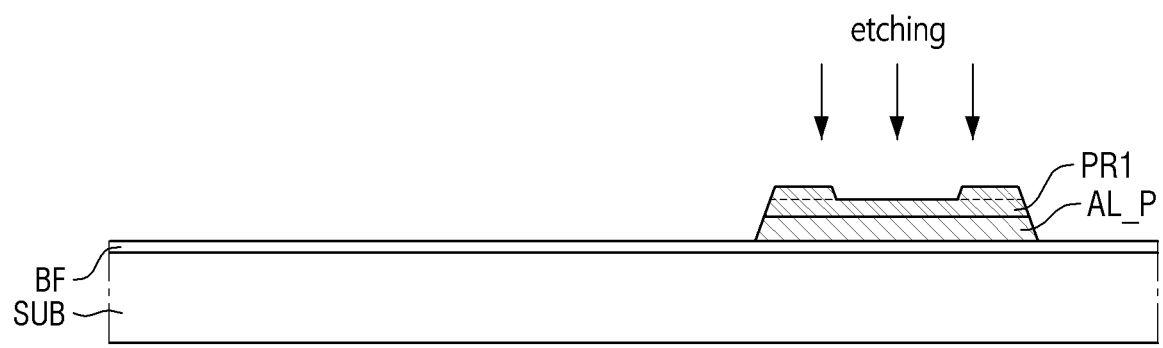

Subsequently as shown in FIGS. 13 and 14, the amorphous silicon layer AL may be etched using the first photoresist pattern PR1 as an etch mask. Specifically, a region of the amorphous silicon layer AL which may be exposed by the first photoresist pattern PR1 may be etched. Accordingly, as the entire region may be etched except the region of the amorphous silicon layer AL overlapped or covered by the first photoresist pattern PR1 in a plan view, a preliminary amorphous silicon pattern AL_P may be formed.

Figure 15:
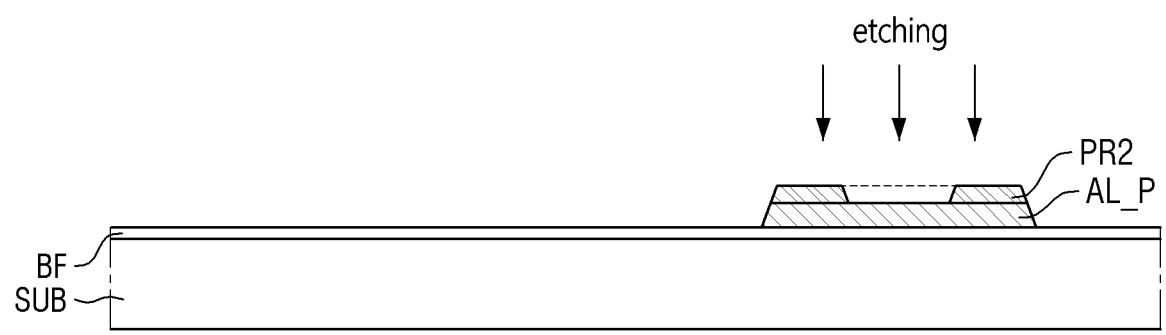

As shown in FIG. 15, the first photoresist pattern PR1 may be etched to form a second photoresist pattern PR2.

Referring to FIGS. 14 and 15, the first photoresist pattern PR1 may be ashed to form the second photoresist pattern PR2. The first photoresist pattern PR1 may be ashed using oxygen plasma containing $O_2$. As the first photoresist pattern PR1 is ashed, a relatively thin portion of the first photoresist pattern PR1 corresponding to semi-transmissive portion HMR3 may be substantially completely removed, and a relatively thick portion of the first photoresist pattern PR1 corresponding to light blocking portion HMR2 may remain after being ashed.

Accordingly, the second photoresist pattern PR2, which overlaps and covers portions of the preliminary amorphous silicon pattern AL_P in a plan view, may be formed.

Figure 16:
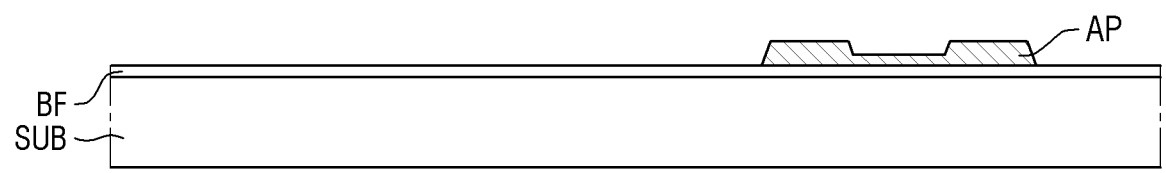

As shown in FIGS. 15 and 16, the preliminary amorphous silicon pattern AL_P may be etched using the second photoresist pattern PR2 as a mask. Specifically, as a region of the preliminary amorphous silicon pattern AL_P which may be exposed by the second photoresist pattern PR2 may be partially etched, the amorphous silicon pattern AP may be formed.

Figure 17:

Referring to FIG. 17, a polycrystalline silicon layer may be formed by irradiating a laser beam onto the amorphous silicon pattern AP (step S300).

Specifically, a polycrystalline silicon layer CL (see FIG. 18) may be formed by irradiating a laser beam onto the amorphous silicon pattern AP. A laser may intermittently generate the laser beam to irradiate it onto the amorphous silicon pattern AP. For example, the laser may be an excimer laser that generates the laser beam having a short wavelength, high power, and high efficiency. For example, the excimer laser may include an inert gas, an inert gas halide, a mercury halide, an inert gas acid compound, a polyatomic excimer, the like, or a combination thereof. For example, the inert gas may be $Ar_2$, $Kr_2$, $Xe_2$, the like, or a combination thereof, the inert gas halide may be ArF, ArCl, KrF, KrCl, XeF, XeCl, the like, or a combination thereof, the mercury halide may be HgCl, HgBr, HgI, the like, or a combination thereof, and the inert gas acid compound may be ArO, KrO, XeO, the like, or a combination thereof, and the polyatomic excimer may be $Kr_2F$, $Xe_2F$, the like, or a combination thereof.

The amorphous silicon pattern AP may be crystallized into the polycrystalline silicon layer CL by irradiating the laser beam from the laser onto the amorphous silicon pattern AP while moving the laser in a horizontal direction. The laser may irradiate the laser beam having an energy density in a range from about 450 mJ/cm² to about 500 mJ/cm² onto the amorphous silicon pattern AP. In case that the energy density of the laser beam is greater than about 450 mJ/cm², the polycrystalline silicon layer CL may be crystallized while forming grains. In case that the energy density of the laser beam is less than about 500 mJ/cm², it may be possible to prevent the amorphous silicon pattern AP from being completely liquefied by the laser beam which would prevent formation of a crystal seed for crystallization of silicon.

Accordingly, in case that crystallizing the amorphous silicon pattern AP including the regions having different thicknesses by irradiating the laser beam thereon, the polycrystalline silicon layer CL, which includes grains having different sizes from each other and grain boundaries having different densities for the respective regions, may be formed as described above in conjunction with FIG. 6.

Figure 18:

Referring to FIG. 18, a first dopant may be primarily doped into the polycrystalline silicon layer CL (step S400).

Specifically, the entire region of the polycrystalline silicon layer CL may be doped with the first dopant without disposing a separate mask on the polycrystalline silicon layer CL. In an embodiment, the first dopant may be doped into the polycrystalline silicon layer CL through an ion implantation technique. In case that the ion implantation technique is applied, the dopant in an ion state may be accelerated to several tens to several hundreds of KeV and implanted into the polycrystalline silicon layer CL.

In an embodiment, the first dopant may be a p-type dopant and may be any one of boron (B), aluminum (Al), gallium (Ga), and indium (In). However, the disclosure is not limited thereto. In some embodiments, the first dopant may be an n-type dopant and may be any one of phosphorus (P), arsenic (As), antimony (Sb), and bismuth (Bi). In the following description, it may be assumed that the first dopant is a p-type dopant and the second dopant is an n-type dopant.

In an embodiment, in case that the polycrystalline silicon layer CL is doped with a p-type dopant, the entire region of the polycrystalline silicon layer CL may have been doped with the p-type dopant.

Referring to FIGS. 19 to 22, the first gate insulating layer GI1 and the gate electrode GE may be sequentially formed on the polycrystalline silicon layer CL that has been doped with the first dopant (step S500). The second dopant may be doped onto the polycrystalline silicon layer CL (step S600).

Specifically, the first gate insulating layer GI1 may be formed on the polycrystalline silicon layer CL. The first gate insulating layer GI1 may be disposed on the buffer layer BF to cover the top surface and the side surface of the polycrystalline silicon layer CL, and may entirely cover the top surface of the buffer layer BF.

Subsequently, the gate electrode GE may be disposed on the first gate insulating layer GI1 to partially overlap or cover the polycrystalline silicon layer CL in a plan view. Specifically, the gate electrode GE may be disposed to correspond to a region having a relatively small thickness among regions of the polycrystalline silicon layer CL, which have different thicknesses from each other. More specifically, among the regions of the polycrystalline silicon layer CL, a region having a relatively large first thickness W1 may be a preliminary source region SR_P in which the source region SR of the active layer ACT to be described later may be formed, and a region having a relatively small second thickness W2 may be a preliminary channel region CR_P in which the channel region CR of the active layer ACT to be described later may be formed.

The first dopant may be secondarily doped onto the polycrystalline silicon layer CL, which has been doped with the first dopant, using the gate electrode GE disposed on the first gate insulating layer GI1 as a self-aligning mask (step S600). In this step, similarly to the step S400 of primarily doping the first dopant into the polycrystalline silicon layer CL, the dopant in an ion state may be implanted through the ion implantation technique. However, unlike the step S400 of primarily doping the first dopant into the polycrystalline silicon layer CL, the first dopant may be doped at a high concentration in some regions of the polycrystalline silicon layer CL.

Figure 20:
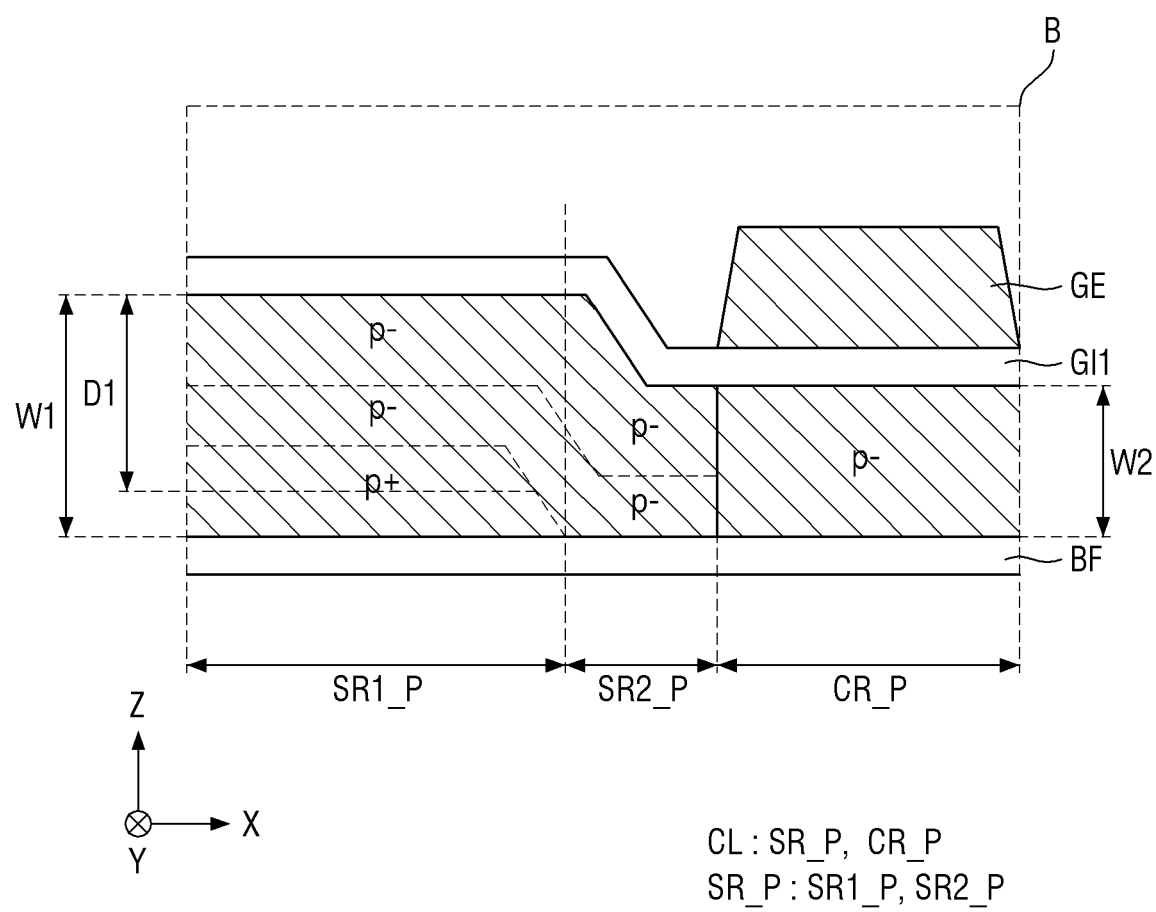

Specifically, referring to FIG. 20, since the gate electrode GE disposed on the first gate insulating layer GI1 overlaps or covers the preliminary channel region CR_P in a plan view and may serve as a mask in case that the first dopant is secondarily doped into the polycrystalline silicon layer CL, the first dopant may not be secondarily doped into the preliminary channel region CR_P.

The preliminary source region SR_P of the polycrystalline silicon layer CL has a first preliminary sub-source region SR1_P having the first thickness W1 and a second preliminary sub-source region SR2_P having the second thickness W2 that may be smaller than the first thickness W1. Therefore, in case that the first dopant is doped, a region to which the first dopant is doped may be set by adjusting an acceleration voltage. In other words, in case that the first dopant may be doped into the polycrystalline silicon layer CL by the ion implantation technique, the first dopant may be doped at a high concentration in a specific region of the polycrystalline silicon layer CL by adjusting the acceleration voltage of the first dopant.

Specifically, in case that the first dopant is doped at a first depth D1 from the top surface of the first preliminary sub-source region SR1_P, the first dopant may be doped into the lower region of the first preliminary sub-source region SR1_P at a high concentration because the first depth D1 may be smaller than the first thickness W1 of the first preliminary sub-source region SR1_P. Also, since the first depth D1 is greater than the thickness W2 of the second preliminary sub-source region SR2_P, the first dopant may not be doped into the second preliminary sub-source region SR2_P at a high concentration as with the first preliminary sub-source region SR1_P.

Since the lower region of the first preliminary sub-source region SR1_P of the polycrystalline silicon layer CL has a first dopant concentration higher than that of other regions of the polycrystalline silicon layer CL, it may be characterized as being p+ doped.

Figure 21:
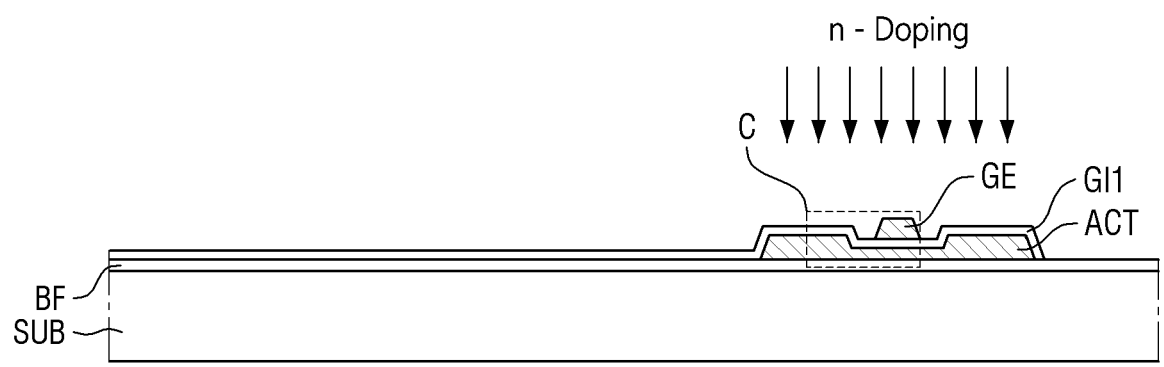
Figure 22:
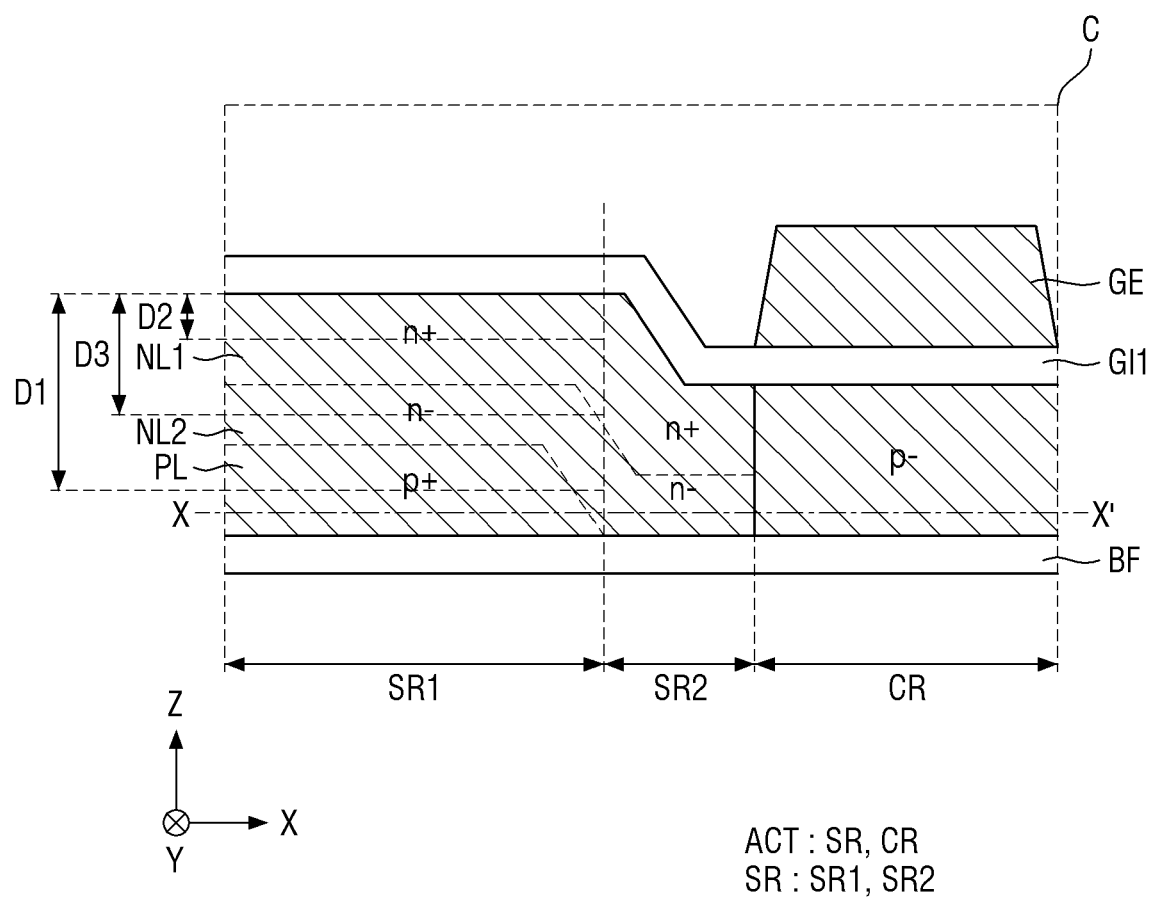

Referring to FIGS. 21 and 22, the second dopant may be doped into the polycrystalline silicon layer CL in which the first dopant has been secondarily doped (step S700).

The active layer including the source region SR, the channel region CR, and the drain region DR may be formed by doping the second dopant in an ion state into the polycrystalline silicon layer CL that has been secondarily doped with the first dopant.

Specifically, referring to FIG. 22, similarly to the step S600 of secondarily doping the first dopant into the polycrystalline silicon layer CL, since the gate electrode GE disposed on the first gate insulating layer GI1 overlaps or covers the channel region CR in a plan view and may serve as a mask in case that the second dopant is doped in the polycrystalline silicon layer CL, the second dopant may not be doped into the channel region CR.

The second dopant may be doped by adjusting the acceleration voltage of the second dopant such that the second dopant may be at a high concentration in a region having a second depth D2 that may be smaller than the first depth D1 from the top surface of the first sub-source region SR1. For example, since the doping depth of the second dopant doped in the region having the second depth D2 may be smaller than the doping depth of the first dopant doped in the region having the first depth D1, the acceleration voltage of the second dopant doped in the region having the second depth D2 may be lower than the acceleration voltage of the first dopant doped in the region having the first depth D1.

Unlike the case of doping the first dopant at the first depth D1, although the first sub-source region SR1 and the second sub-source region SR2 have different thicknesses, the second depth D2 may be smaller than the thickness W2 of the second sub-source region SR2, so that the second dopant may be doped at a high concentration in both the upper region of the first sub-source region SR1 and the upper region of the second sub-source region SR2.

As described above, in the lower region of the first sub-source region SR1, the p-type doped layer PL, which has the high first dopant concentration and may be doped with p+, may remain. In the upper region of the first sub-source region SR1, the first n-type doped layer NL1, which has the high second dopant concentration and may be doped with n+, may be formed. Between the p-type doped layer PL and the first n-type doped layer NL1, the second n-type doped layer NL2 which has the high second dopant concentration and is doped with n−, may be formed.

As described above, the second n-type doped layer NL2 may be formed while the second dopant may be doped in the region having the second depth D2 in the first sub-source region SR1 after doping the first dopant into the region having the first depth D1 therein. In other words, since a region having a third depth D3 from the top surface of the first sub-source region SR1 may be located between the region having the first depth D1 and the region having the second depth D2, the first dopant and the second dopant may be partially doped therein in case that the first dopant and the second dopant are doped. Further, since the region having the third depth D3 may be closer to the region having the second depth D2, the second dopant concentration may be higher than the first dopant concentration in the region having the third depth D3. Further, since the second n-type doped layer NL2 has a lower concentration of the second dopant than the concentration of the second dopant included in the first n-type doped layer NL1, it may be characterized as n−.

In the second sub-source region SR2, the first n-type doped layer NL1 having the high concentration of the second dopant and characterized as n+ may be formed in the upper region by a same process as that of the first sub-source region SR1. The second n-type doped layer NL2 doped with n− may be formed in the lower region of the second sub-source region SR2.

Accordingly, in case that the display device 10 is fabricated by the method of fabricating the display device 10 according to an embodiment, the thicknesses of the source region SR, the drain region DR, and the channel region CR, which are included in the active layer ACT of the thin film transistor ST, are formed to be different, so that at least one of the doping processes of the active layer ACT of the thin film transistor ST and at least one of the masking processes of the active layer ACT thereof may be omitted.

Also, since the process of depositing an inorganic layer on the sidewall of the gate electrode GE serving as the doping mask and the process of etching the inorganic layer may be omitted, the fabrication process of the display device 10 may be simplified.

In the above discussion of FIGS. 18 to 22, the doping processes have been described by focusing on the source region SR and the channel region CR of the active layer ACT. However, the drain region DR of the active layer ACT may also include the same dopants and doped layers as the source region SR and may have a symmetrical structure thereto through a same process as the source region SR.

Figure 23:
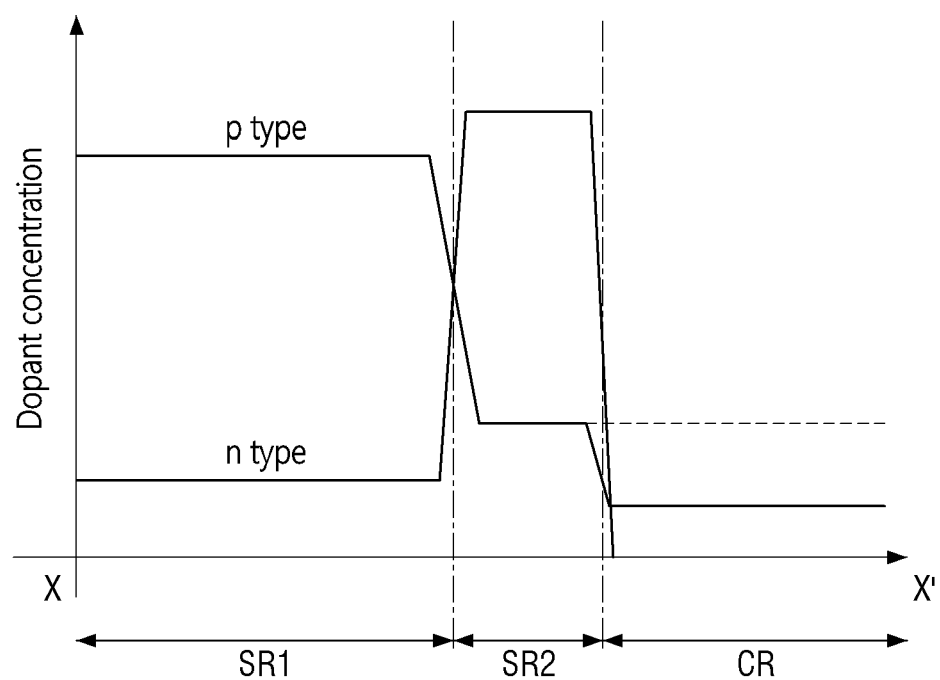
FIG. 23 is a graph illustrating concentrations of dopants doped in respective regions in line X-X' of FIG. 22.

FIG. 23 is a graph illustrating concentrations of dopants doped in respective regions in line X-X' of FIG. 22.

Referring to FIG. 23, an X-axis represents the source region SR and the channel region CR of the active layer ACT in line X-X' of FIG. 22, and a Y-axis represents concentrations of dopants doped in the source region SR and the channel region CR of the active layer ACT in line X-X' of FIG. 22.

Referring to FIG. 22, the line X-X' may be an arbitrary line that extends in the lower region of the active layer ACT in the first direction X. Since the line X-X' extends in the lower regions of the first sub-source region SR1, the second sub-source region SR2, and the channel region CR, the graph shown in FIG. 23 represents concentrations of dopants included in (i.e., dopants implanted in) the lower region of the first sub-source region SR1, the lower region of the second sub-source region SR2, and the lower region of the channel region CR.

Referring to FIGS. 22 and 23, since the p-type doped layer PL, in which the p-type dopant concentration may be higher than the n-type dopant concentration, may be located in the lower region of the first sub-source region SR1, the p-type dopant concentration may be higher than the n-type dopant concentration in the lower region of the first sub-source region SR1.

Specifically, the p-type doped layer PL located in the lower region of the first sub-source region SR1 may be doped with a high concentration of a p-type dopant by a process of doping the p-type dopant at a high concentration into a region having the first depth D1 from the top surface of the active layer ACT, and may be doped with a part of an n-type dopant by a process of doping the n-type dopant at a high concentration into a region having the second depth D2 from the top surface of the active layer ACT. In other words, in case that a dopant in an ion state is implanted by the ion implantation technique, since the n-type dopant may be doped at a high concentration into the region having the second depth D2 from the top surface of the active layer ACT, and the n-type dopant may be doped at a low concentration into the periphery of the region having the second depth D2, the p-type doped layer PL located in the lower region of the first sub-source region SR1 may contain a small amount of the n-type dopant.

Since the second n-type doped layer NL2, in which the n-type dopant concentration may be higher than the p-type dopant concentration, may be located in the lower region of the second sub-source region SR2, the n-type dopant concentration may be higher than the p-type dopant concentration in the lower region of the second sub-source region SR2.

Specifically, the first n-type doped layer NL1, which may be located in the upper region of the second sub-source region SR2, may be doped with a high concentration of an n-type dopant by a process of doping the n-type dopant at a high concentration into a region having the second depth D2 from the top surface of the active layer ACT, and the second n-type doped layer NL2, which may be located in the lower region of the second sub-source region SR2, may be doped with a part of the p-type dopant by the process of doping the p-type dopant at a high concentration into the region having the first depth D1 from the top surface of the active layer ACT. Accordingly, the second n-type doped layer NL2 may be doped with a lower concentration of the n-type dopant than the concentration of the n-type dopant included in the first n-type doped layer NL1 that may be located in the upper region of the second sub-source region SR2.

The p-type doped layer PL, which may be located in the lower region of the first sub-source region SR1, may be doped with the high concentration of the p-type dopant in the process of doping the p-type dopant at the high concentration into the region having the first depth D1 from the top surface of the active layer ACT. The second n-type doped layer NL2, which may be located in the lower region of the second sub-source region SR2, may include (i.e., be implanted with) the small amount of the p-type dopant because it may be doped with a part of the p-type dopant in the process of doping the p-type dopant at the high concentration into the region having the first depth D1 from the top surface of the active layer ACT. Therefore, the concentration of the p-type dopant included in (i.e., concentration of p-type dopant implanted in) the p-type doped layer PL may be higher than the concentration of the p-type dopant included in (i.e., concentration of p-type dopant implanted in) the second n-type doped layer NL2.

The lower region of the channel region CR does not include the n-type dopant, but includes only the p-type dopant.

Specifically, as described above, the channel region CR may be doped with the p-type dopant in the step S400 of primarily doping the p-type dopant into the polycrystalline silicon layer, and thus the channel region CR includes the p-type dopant. Since the gate electrode GE serves as a mask in the process of doping the n-type dopant into the polycrystalline silicon layer, the channel region CR overlapped or covered by the gate electrode GE in a plan view may not be doped with the n-type dopant.

Also, referring to the graph shown in FIG. 23, the concentration of the p-type dopant included in the channel region CR may be substantially a same as or smaller than the concentration of the p-type dopant included in the lower region of the second sub-source region SR2.

Specifically, in the graph shown in FIG. 23, the case where the concentration of the p-type dopant included in the channel region CR is indicated by a dotted line corresponds to a case where, in the process of doping the region, which has the first depth D1 from the top surface of the active layer ACT, with a high concentration of the p-type dopant, a part of the p-type dopant may be doped into the second n-type doped layer NL2 located in the lower region of the second sub-source region SR2 so that the concentration of the p-type dopant included in (i.e., concentration of p-type dopant implanted in) the second n-type doped layer NL2 becomes substantially a same as the concentration of the p-type dopant included in (i.e., concentration of p-type dopant implanted in) the channel region CR. Further, the case where the concentration of the p-type dopant included in the channel region CR is indicated by a solid line corresponds to a case where, in the process of doping the region, which has the first depth D1 from the top surface of the active layer ACT, with a high concentration of the p-type dopant, a part of the p-type dopant may be doped into the second n-type doped layer NL2 located in the lower region of the second sub-source region SR2 so that the concentration of the p-type dopant included the second n-type doped layer NL2 becomes substantially higher than the concentration of the p-type dopant included in the channel region CR.

Accordingly, the lower region of the active layer ACT may be sequentially doped with p+, n−, and p− in the first direction X starting from the first sub-source region SR1 to have a bipolar structure.

Hereinafter, other embodiments of a method of fabricating a display device will be described. In the following embodiments, description of the same components as those of the above-described embodiment, which are denoted by like reference numerals, will be omitted or simplified, and differences will be mainly described.

Figure 24:
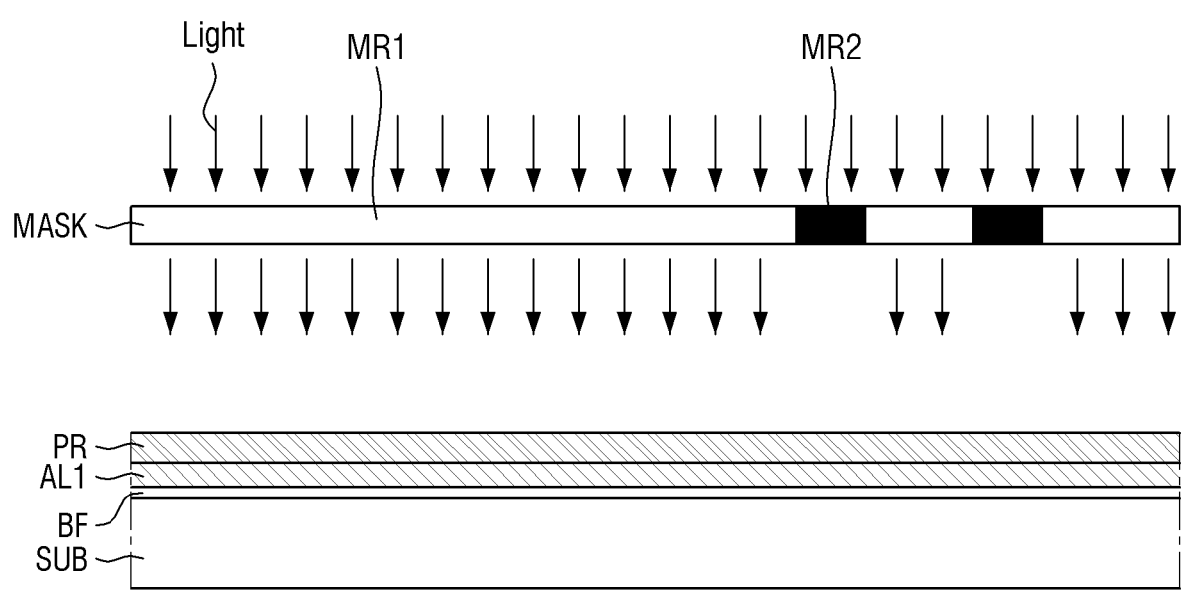
FIGS. 24 to 26 are schematic diagrams showing a method of fabricating a display device according to still an embodiment.
Figure 25:
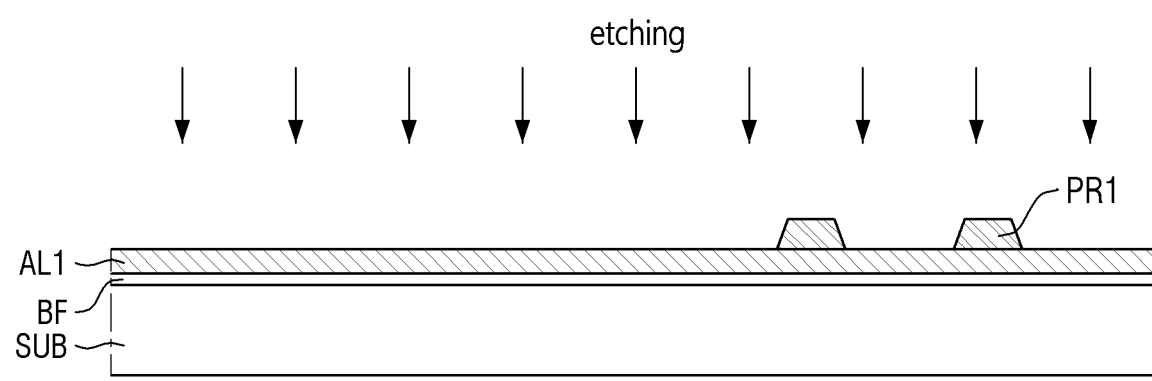
Figure 26:
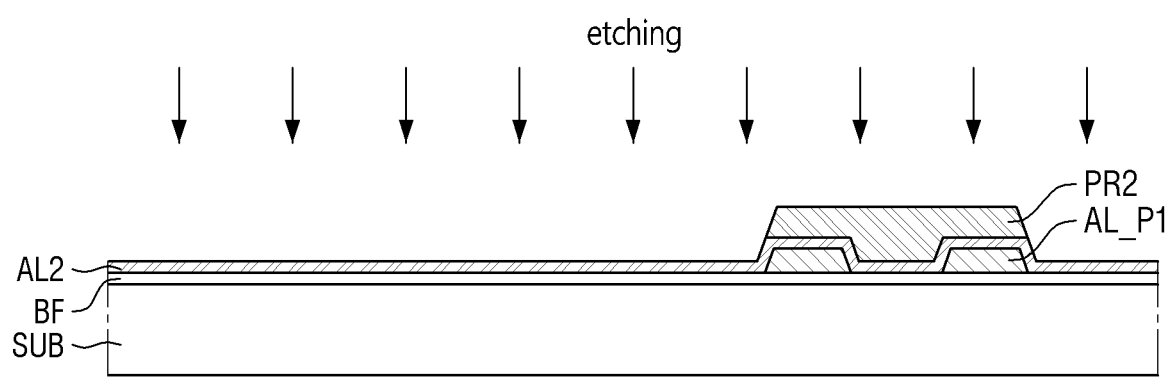

FIGS. 24 to 26 are schematic diagrams showing a method of fabricating a display device according to an embodiment.

FIGS. 24 to 26 are schematic diagrams illustrating the step S200 of patterning the amorphous silicon layer AL according to an embodiment.

First, as shown in FIG. 24, the photoresist layer PR may be formed on a first amorphous silicon layer AL1. A photomask MASK may be disposed on the photoresist layer PR, and the photoresist layer PR may be exposed using the photomask MASK. The photomask MASK may include a light transmitting portion MR1 and a light blocking portion MR2. The light transmitting portion MR1 may transmit light, and the light blocking portion MR2 may block light.

Subsequently, as shown in FIG. 25, the photoresist layer PR, to which light has been irradiated through the photomask MASK, may be developed to form the first photoresist pattern PR1. A part of the photoresist layer PR, which corresponds to the light transmitting portion MR1 may be substantially completely removed, and a part of the photoresist layer PR, which corresponds to the light blocking portion MR2, may remain substantially unremoved. Accordingly, the first photoresist pattern PR1 may be formed on the first amorphous silicon layer AL1.

As shown in FIGS. 25 and 26, the first amorphous silicon layer AL1 may be etched using the first photoresist pattern PR1 as a mask. In other words, a region of the first amorphous silicon layer AL1, which may be exposed by the first photoresist pattern PR1, may be etched. Accordingly, as the region of the first amorphous silicon layer AL1 except the region overlapped or covered by the first photoresist pattern PR1 may be entirely etched, a preliminary amorphous silicon pattern AL_P1 may be formed.

Referring to FIG. 26, after coating a second amorphous silicon layer AL2 on the preliminary amorphous silicon pattern AL_P1 and the buffer layer BF, the second photoresist pattern PR2 may be formed on the second amorphous silicon layer AL2 that overlaps or covers the first preliminary amorphous silicon pattern AL_P1. The second photoresist pattern PR2 may be formed in a same method as described above.

The second amorphous silicon layer AL2 may be etched using the second photoresist pattern PR2 as an etch mask. Specifically, a region of the second amorphous silicon layer AL2, which may be exposed by the second photoresist pattern PR2, may be etched. Accordingly, as the region of the second amorphous silicon layer AL2 except the region overlapped or covered by the second photoresist pattern PR2 may be entirely etched, the amorphous silicon pattern AP shown in FIG. 16 may be formed.

Figure 27:
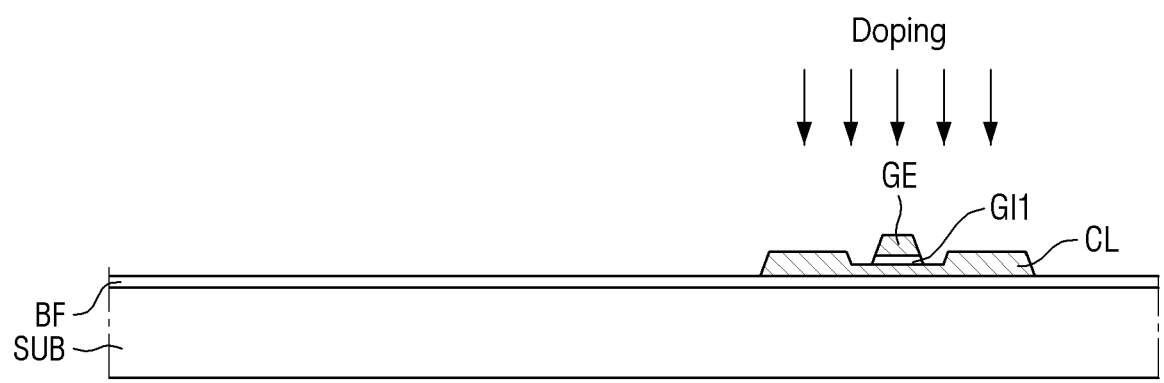
FIG. 27 is a schematic diagram illustrating a method of fabricating a display device according to still an embodiment.

FIG. 27 is a schematic diagram illustrating a method of fabricating a display device according to an embodiment.

Figure 19:
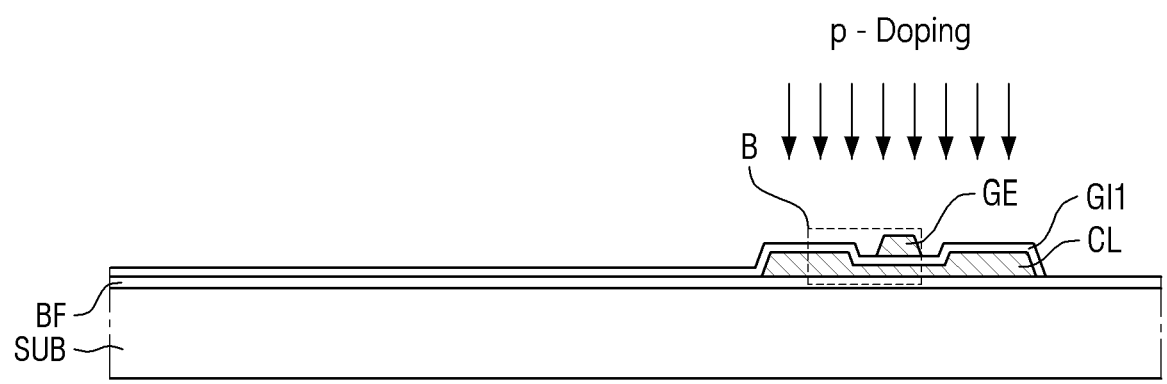

The embodiment according to FIG. 27 is the same as the embodiment according to FIGS. 19 and 21 in that the first gate insulating layer GI1 and the gate electrode GE are sequentially formed on the polycrystalline silicon layer CL doped with the first dopant. However, in this embodiment, the first gate insulating layer GI1 may be disposed only on portions of the polycrystalline silicon layer CL overlapped or covered by the gate electrode GE in a plan view and unlike the embodiment according to FIGS. 19 and 21 in which the first gate insulating layer GI1 is disposed on the polycrystalline silicon layer CL and the buffer layer BF while covering all of the top surface and the side surface of the polycrystalline silicon layer CL and the top surface of the buffer layer BF.

Further, unlike the embodiment according to FIGS. 19 and 21, as shown in FIG. 27, in case that doping a p-type dopant and an n-type dopant, the p-type dopant and the n-type dopant are doped (e.g., directly doped) onto the polycrystalline silicon layer CL where the first gate insulating layer GI1 may be not disposed, and the doping depth may be decreased by the thickness of the first gate insulating layer GI1.

Figure 28:
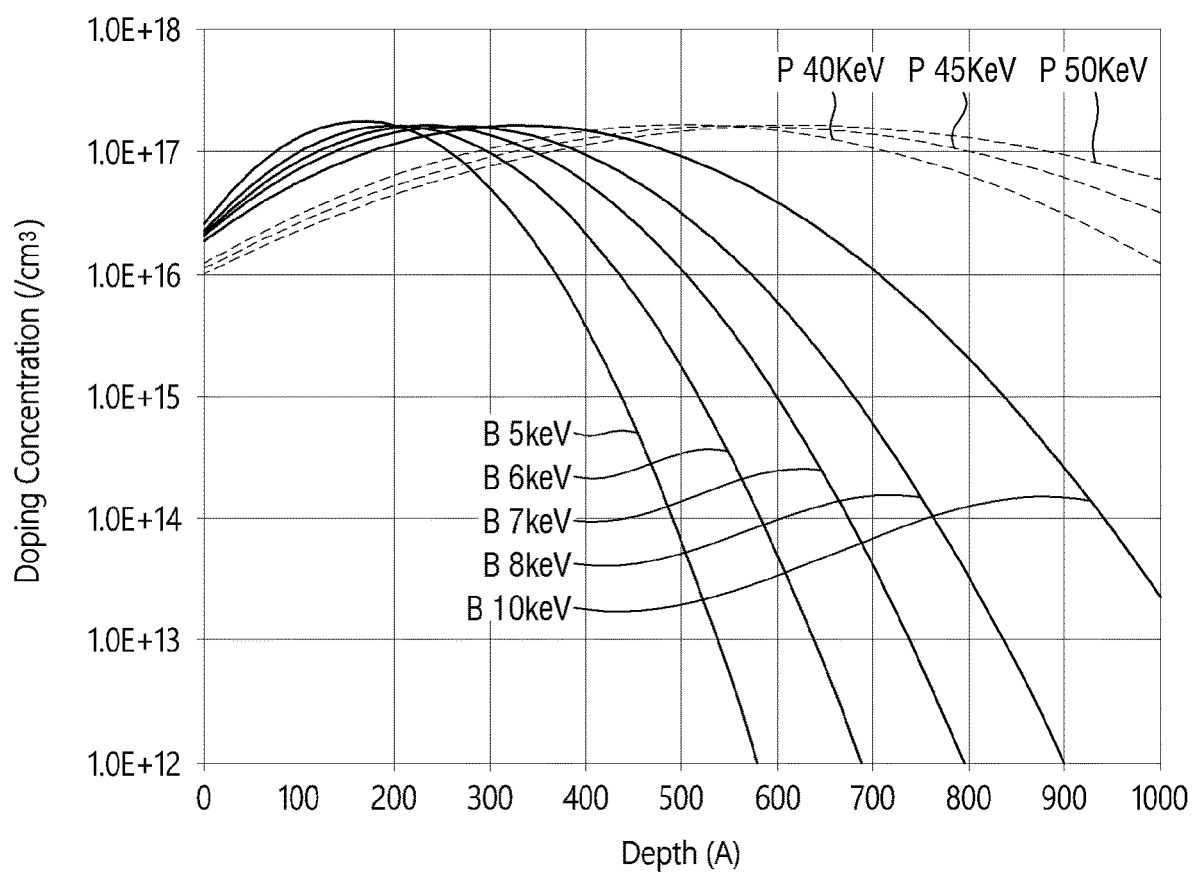
FIG. 28 is a graph illustrating a relationship between an acceleration voltage of dopants and a concentration of dopants according to doping depth.

FIG. 28 is a graph illustrating a relationship between an acceleration voltage of dopants and a concentration of dopants according to a doping depth.

Referring to the graph shown in FIG. 28, an X-axis represents a doping depth of a dopant doped into a polycrystalline silicon layer, and a Y-axis represents a concentration of a dopant according to the doping depth. In the graph, a solid line shows a concentration change of boron (B) as a p-type dopant according to a doping depth for each acceleration voltage, and a dotted line shows a concentration change of phosphorus (P) as an n-type dopant according a doping depth for each acceleration voltage.

Specifically, in the case of the p-type dopant and the n-type dopant, the acceleration voltage of the dopant needs to be increased in order to increase the doping depth of the dopant while maintaining the concentration of the dopant doped. As the acceleration voltage of the dopant increases, the concentration change of the dopant according to the doping depth tends to be more gradual.

For the n-type dopant, in order to be doped at a same concentration as the p-type dopant at a doping depth deeper than that of the p-type dopant, the n-type dopant needs to be accelerated at a higher voltage than the acceleration voltage of the p-type dopant.

For the p-type dopant, in order to be doped with about 1.0e+17.02 to about 1.0e+17.03 dopants per 1 $cm^3$ at a doping depth of about 150 Å (angstroms), the p-type dopant needs to be accelerated at a voltage of 5 keV, and in order to be doped with about 1.0e+17.02 to about 1.0e+17.03 dopants per 1 $cm^3$ at a doping depth of about 350 Å (angstroms), the p-type dopant needs to be accelerated at a voltage of 10 keV.

In case that the p-type dopant is accelerated at 5 keV, compared to the case where the p-type dopant is accelerated at the voltage of 10 keV, a concentration change rate of the dopant according to the doping depth increases. Therefore, the dopant may be doped into the polycrystalline silicon layer by more precisely controlling the dopant concentration.

For the n-type dopant, as with the p-type dopant, in order to be doped with about 1.0e+17.02 to about 1.0e+17.03 dopants per 1 $cm^3$ at a doping depth of about 500 Å (angstroms), the n-type dopant needs to be accelerated at a voltage of 40 keV, and in order to be doped with about 1.0e+17.02 to about 1.0e+17.03 dopants per 1 $cm^3$ at a doping depth of about 650 Å (angstroms), the n-type dopant needs to be accelerated at a voltage of 50 keV.

Further, for the n-type dopant, as with the p-type dopant, in case that the n-type dopant is accelerated at 40 keV, compared to the case where the n-type dopant is accelerated at the voltage of 50 keV, the concentration change rate of the dopant according to the doping depth increases, but the concentration change rate of the dopant according to the doping depth may be smaller than the concentration change rate in the case of the p-type dopant.

In other words, as the doping depth of the dopant doped into the polycrystalline silicon layer may be smaller, the voltage accelerating to the dopant may be lower, and accordingly, the concentration change rate according to the doping depth increases. Therefore, it may be possible to precisely control the concentration of a dopant doped during the doping process.

In the embodiment according to FIG. 27, since the first gate insulating layer GI1 may not be disposed on the polycrystalline silicon layer CL doped with the n-type dopant and the p-type dopant, the n-type dopant and the p-type dopant may be doped at smaller doping depths compared to the case where the first gate insulating layer GI1 is disposed on the polycrystalline silicon layer CL.

Therefore, as described above, it may be possible to lower the acceleration voltages of the n-type dopant and the p-type dopant doped into the polycrystalline silicon layer CL, thereby precisely controlling the concentrations of the n-type dopant and the p-type dopant to form doped layers in the lower region and the upper region of the polycrystalline silicon layer CL.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device, comprising:
an active layer disposed on a substrate, the active layer comprising a channel region and a first conductive region, the first conductive region comprising a first sub-conductive region disposed on a first side of the channel region, and a second sub-conductive region disposed between the first sub-conductive region and the channel region,
wherein the first conductive region further comprises:
a first doped layer being disposed on the substrate in the first sub-conductive region, wherein in the first doped layer, a concentration of a first dopant is higher than a concentration of a second dopant that is different from the first dopant;
a second doped layer being disposed on the first doped layer in the first sub-conductive region, the second doped layer also being disposed on the substrate in the second sub-conductive region, wherein in the second doped layer, a concentration of the second dopant is higher than a concentration of the first dopant; and
a third doped layer being disposed on the second doped layer in both the first sub-conductive region and the second sub-conductive region, wherein in the third doped layer, a concentration of the second dopant is higher than a concentration of the first dopant.

2. The display device of claim 1, wherein a thickness of the first doped layer is smaller than a thickness of the channel region.

3. The display device of claim 1, wherein a thickness of the second doped layer is smaller than each of a thickness of the first doped layer and a thickness of the third doped layer.

4. The display device of claim 1, wherein a thickness of the first sub-conductive region is greater than a thickness of the second sub-conductive region.

5. The display device of claim 1, wherein
the channel region comprises the first dopant,
a concentration of the first dopant in the first doped layer is higher than a concentration of the first dopant in the channel region, and
the first dopant is a p-type dopant, and the second dopant is an n-type dopant.

6. The display device of claim 1, wherein
the channel region comprises the first dopant,
a concentration of the first dopant in the first doped layer is higher than a concentration of the first dopant in the channel region, and
the first dopant is an n-type dopant, and the second dopant is a p-type dopant.

7. The display device of claim 1, wherein
the channel region comprises the second dopant,
a concentration of the second dopant in the second doped layer is higher than a concentration of the second dopant in the channel region, and
the first dopant is an n-type dopant, and the second dopant is a p-type dopant.

8. The display device of claim 1, wherein
the active layer further comprises a second conductive region disposed on a second and opposite side of the channel region, the second conductive region and the first conductive region have a same structure, and the second conductive region is symmetrical with the first conductive region.

9. The display device of claim 8, further comprising:
a first gate insulating layer disposed on the active layer; and
a gate electrode disposed on the first gate insulating layer and overlapping the channel region in a plan view.

10. The display device of claim 9, wherein the first gate insulating layer is disposed at a portion where the gate electrode and the channel region overlap, and does not overlap the first conductive region and the second conductive region in a plan view.

11. The display device of claim 9, further comprising:
a second gate insulating layer disposed on the gate electrode;
a first contact hole and a second contact hole each penetrating both of the first gate insulating layer and the second gate insulating layer;
a source electrode disposed on the second gate insulating layer and electrically connected to the first conductive region exposed through the first contact hole; and
a drain electrode disposed on the second gate insulating layer and electrically connected to the second conductive region exposed through the second contact hole.

12. A display device, comprising:
an active layer disposed on a substrate, the active layer comprising:
a channel region comprising a first dopant; and
a first conductive region comprising a first sub-conductive region disposed on a first side of the channel region, and a second sub-conductive region disposed between the first sub-conductive region and the channel region, wherein the first conductive region further comprises:
a first doped layer being disposed on the substrate in the first sub-conductive region, wherein in the first doped layer, a concentration of the first dopant is higher than a concentration of a second dopant that is different from the first dopant;
a second doped layer being disposed on the first doped layer in the first sub-conductive region, the second doped layer also being disposed on the substrate in the second sub-conductive region, wherein in the second doped layer, a concentration of the second dopant is higher than a concentration of the first dopant; and
a third doped layer being disposed on the second doped layer in both the first sub-conductive region and the second sub-conductive region, wherein in the third doped layer, a concentration of the second dopant is higher than a concentration of the first dopant, wherein
a concentration of the second dopant in the third doped layer is higher than a concentration of the second dopant in the second doped layer, and
a grain size of the first sub-conductive region is smaller than a grain size of the second sub-conductive region.

13. The display device of claim 12, wherein a grain boundary density in the first sub-conductive region is greater than a grain boundary density in the second sub-conductive region.

14. The display device of claim 12, wherein a thickness of the first sub-conductive region is greater than a thickness of the channel region.

15. The display device of claim 12, wherein a thickness of the second sub-conductive region is substantially equal to a thickness of the channel region.

* * * * *